US009704853B2

(12) United States Patent
Bode et al.

(10) Patent No.: US 9,704,853 B2
(45) Date of Patent: Jul. 11, 2017

(54) SEMICONDUCTOR DEVICE AND DRIVER CIRCUIT WITH AN ACTIVE DEVICE AND ISOLATION STRUCTURE INTERCONNECTED THROUGH A RESISTOR CIRCUIT, AND METHOD OF MANUFACTURE THEREOF

(71) Applicants: Hubert M. Bode, Haar (DE); Weize Chen, Phoenix, AZ (US); Richard J. De Souza, Chandler, AZ (US); Patrice M. Parris, Phoenix, AZ (US)

(72) Inventors: Hubert M. Bode, Haar (DE); Weize Chen, Phoenix, AZ (US); Richard J. De Souza, Chandler, AZ (US); Patrice M. Parris, Phoenix, AZ (US)

(73) Assignee: NXP USA, INC., Austin, TX (US)

( * ) Notice: Subject to any disclaimer, the term of this patent is extended or adjusted under 35 U.S.C. 154(b) by 684 days.

(21) Appl. No.: 13/671,506

(22) Filed: Nov. 7, 2012

(65) Prior Publication Data

US 2014/0001549 A1 Jan. 2, 2014

Related U.S. Application Data

(63) Continuation-in-part of application No. 13/538,577, filed on Jun. 29, 2012, now abandoned.

(51) Int. Cl.
*H01L 27/04* (2006.01)
*H01L 21/02* (2006.01)
(Continued)

(52) U.S. Cl.
CPC ........ *H01L 27/04* (2013.01); *H01L 21/02381* (2013.01); *H01L 21/761* (2013.01);
(Continued)

(58) Field of Classification Search
CPC ................... H01L 27/04; H01L 21/02
(Continued)

(56) References Cited

U.S. PATENT DOCUMENTS 5,156,989 A 10/1992 Williams et al.
5,257,175 A 10/1993 Skelton et al.
(Continued)

FOREIGN PATENT DOCUMENTS

CN 101523554 A 9/2009
CN 102593119 A 7/2012
(Continued)

OTHER PUBLICATIONS

U.S. Appl. No. 13/538,529, Office Action—Rejection, mailed Jul. 18, 2014.
(Continued)

*Primary Examiner* — Olik Chaudhuri
*Assistant Examiner* — Lamont Koo
(74) *Attorney, Agent, or Firm* — Sherry W. Schumm

(57) ABSTRACT

Embodiments of semiconductor devices and driver circuits include a semiconductor substrate having a first conductivity type, an isolation structure (including a sinker region and a buried layer), an active device within a portion of the substrate contained by the isolation structure, and a resistor circuit. The buried layer is positioned below the top substrate surface, and has a second conductivity type. The sinker region extends between the top substrate surface and the buried layer, and has the second conductivity type. The active device includes a body region, which is separated from the isolation structure by a portion of the semiconductor substrate having the first conductivity type. The resistor circuit is connected between the isolation structure and the body region. The resistor circuit may include one or more resistor networks and, optionally, a Schottky diode and/or
(Continued)

one or more PN diode(s) in series and/or parallel with the resistor network(s).

27 Claims, 12 Drawing Sheets

(51) Int. Cl.
| | | |
|---|---|---|
| *H01L 29/66* | (2006.01) | |
| *H01L 29/78* | (2006.01) | |
| *H01L 27/06* | (2006.01) | |
| *H01L 21/761* | (2006.01) | |
| *H01L 29/06* | (2006.01) | |
| *H01L 29/08* | (2006.01) | |
| *H01L 29/10* | (2006.01) | |
| *H01L 27/092* | (2006.01) | |

(52) U.S. Cl.
CPC .... *H01L 27/0629* (2013.01); *H01L 29/66659* (2013.01); *H01L 29/66689* (2013.01); *H01L 29/7817* (2013.01); *H01L 29/7835* (2013.01); H01L 27/092 (2013.01); H01L 29/0653 (2013.01); H01L 29/0847 (2013.01); H01L 29/0869 (2013.01); H01L 29/0878 (2013.01); H01L 29/1083 (2013.01); H01L 29/1095 (2013.01)

(58) Field of Classification Search
USPC .......... 257/337, E27.016, E21.544; 438/478, 438/382
See application file for complete search history.

(56) References Cited

U.S. PATENT DOCUMENTS

| | | | |
|---|---|---|---|
| 5,834,826 A * | 11/1998 | Menegoli | ............ H01L 27/0248 257/355 |
| 5,889,310 A | 3/1999 | Terashima et al. | |
| 6,288,424 B1 | 9/2001 | Ludikhuize | |
| 6,573,562 B2 | 6/2003 | Parthasarathy et al. | |
| 6,727,547 B1 | 4/2004 | Brisbin et al. | |
| 6,784,489 B1 * | 8/2004 | Menegoli | ....................... 257/343 |
| 7,064,407 B1 | 6/2006 | Mallikarjunaswamy | |
| 7,141,860 B2 | 11/2006 | Khemka et al. | |
| 7,282,386 B2 | 10/2007 | Khemka et al. | |
| 7,439,584 B2 | 10/2008 | Khemka et al. | |
| 8,569,836 B2 | 10/2013 | Lee | |
| 2003/0080381 A1 | 5/2003 | Parthasarathy et al. | |
| 2003/0127687 A1 | 7/2003 | Kumagai et al. | |
| 2006/0011974 A1 | 1/2006 | Pendharkar | |
| 2006/0261408 A1 | 11/2006 | Khemka et al. | |
| 2009/0267110 A1 | 10/2009 | Cai | |
| 2009/0294849 A1 | 12/2009 | Min et al. | |
| 2011/0057262 A1 | 3/2011 | Ma et al. | |
| 2011/0101425 A1 | 5/2011 | Grote et al. | |
| 2011/0187475 A1 | 8/2011 | Kim et al. | |
| 2011/0241083 A1 | 10/2011 | Khemka et al. | |
| 2012/0175673 A1 * | 7/2012 | Lee | ............................... 257/140 |
| 2014/0001473 A1 | 1/2014 | Chen et al. | |

FOREIGN PATENT DOCUMENTS

| | | |
|---|---|---|
| EP | 2680299 A2 | 1/2014 |
| EP | 2731144 A2 | 5/2014 |

OTHER PUBLICATIONS

U.S. Appl. No. 13/538,577, Office Action—Restriction, mailed May 14, 2014.
U.S. Appl. No. 13/538,565, Office Action—Restriction, mailed May 7, 2014.
U.S. Appl. No. 13/538,565, Office Action—Rejection, mailed Jul. 18, 2014.
U.S. Appl. No. 13/671,503, Office Action—Rejection, mailed Jul. 31, 2014.
U.S. Appl. No. 13/538,577, Bode, H.M., Office Action—Rejection, mailed Sep. 22, 2014.
EP 13172894.1, European Extended Search Report mailed Nov. 3, 2014.
EP 13191777.5, European Extended Search Report mailed Dec. 2, 2014.
EP 13173226.5, European Extended Search Report mailed Dec. 8, 2014.
U.S. Appl. No. 13/671,503, Office Action—Restriction, mailed Feb. 12, 2015.
U.S. Appl. No. 13/538,529, Office Action—Restriction, mailed Feb. 12, 2015.
U.S. Appl. No. 13/538,565, Office Action—Restriction, mailed Feb. 18, 2015.
U.S. Appl. No. 13/538,577, Office Action—Final Rejection, mailed Jan. 23, 2015.
Notice of Allowance mailed Jul. 16, 2015 for U.S. Appl. No. 13/671,503, 9 pgs.
Notice of Allowance mailed Jun. 22, 2015 for U.S. Appl. No. 13/538,529, 8 pgs.
Non-Final Rejection mailed May 8, 2015 for U.S. Appl. No. 13/538,577, 13 pgs.
Notice of Allowance mailed Jun. 22, 2015 for U.S. Appl. No. 13/538,565, 8 pgs.
Extended European Search Report mailed Jun. 26, 2015 for EP Application No. EP 13191789, 9 pages.
Final Rejection mailed Dec. 7, 2015 for U.S. Appl. No. 13/538,577 36 pgs.

* cited by examiner

SEMICONDUCTOR DEVICE AND DRIVER CIRCUIT WITH AN ACTIVE DEVICE AND ISOLATION STRUCTURE INTERCONNECTED THROUGH A RESISTOR CIRCUIT, AND METHOD OF MANUFACTURE THEREOF

RELATED APPLICATION

This application is a continuation-in-part of co-pending, U.S. patent application Ser. No. 13/538,577, filed on Jun. 29, 2012, and subject to assignment to the same assignee as the present application.

TECHNICAL FIELD

Embodiments generally relate to semiconductor devices and their manufacturing methods, and more particularly relate to laterally diffused metal oxide semiconductor (LDMOS) devices with isolation structures.

BACKGROUND

In some system-on-a-chip (SOC) applications that include an inductive load, certain nodes may experience a negative potential during switching, which may lead to significant injection current into the substrate. The charged carriers injected into the substrate may disturb adjacent circuits and adversely affect their operation.

Accordingly, there is an ongoing need for improved device structures, materials and methods of fabrication that can overcome this difficulty and provide improved performance. It is further desirable that the methods, materials, and structures employed be compatible with present day manufacturing capabilities and materials and not require substantial modifications to available manufacturing procedures or substantial increases in manufacturing costs. Furthermore, other desirable features and characteristics of the various embodiments will become apparent from the subsequent detailed description and the appended claims, taken in conjunction with the accompanying drawings and the foregoing technical field and background.

BRIEF DESCRIPTION OF THE DRAWINGS

Embodiments will hereinafter be described in conjunction with the following drawing figures, wherein like numerals denote like elements.

DETAILED DESCRIPTION

Figure 1:
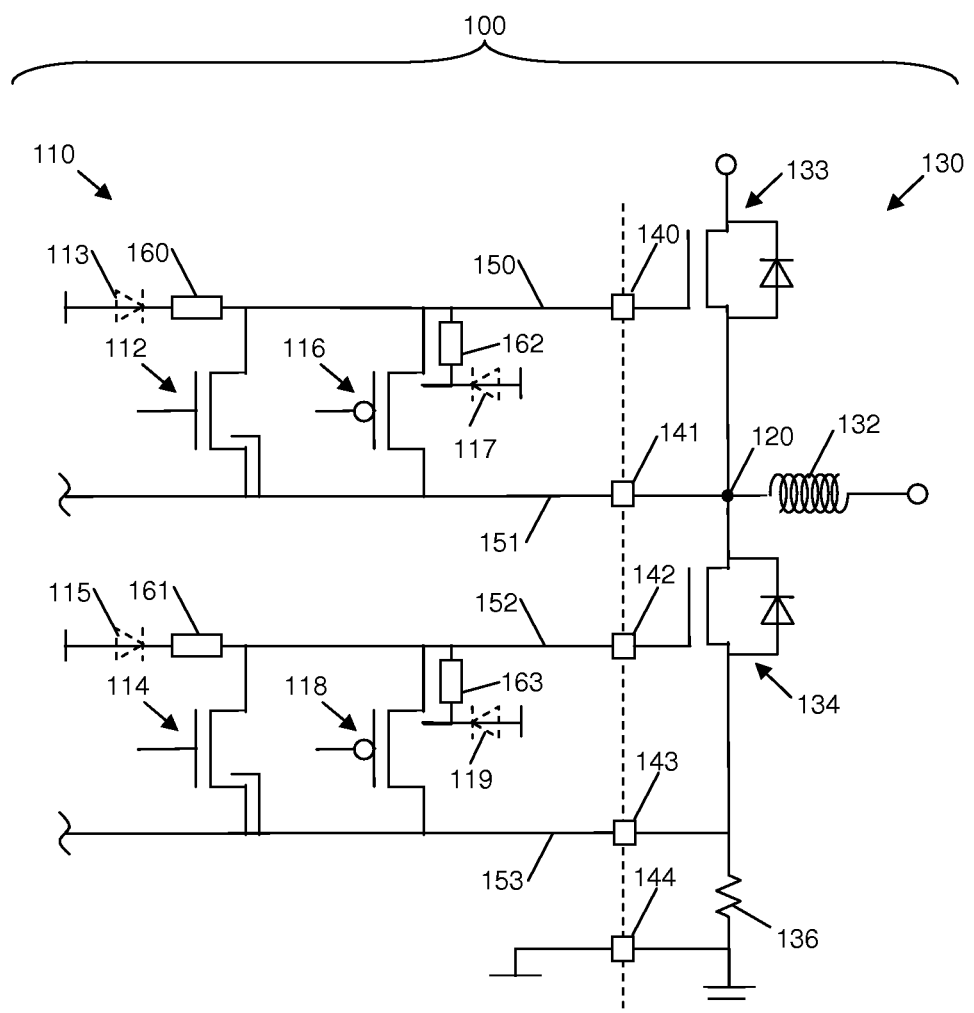
FIG. 1 is a simplified diagram of an electronic system that includes a driver circuit configured to drive an external circuit that includes an inductive load, according to an embodiment.

The following detailed description is merely exemplary in nature and is not intended to limit the embodiments or the application and uses of the various embodiments. Furthermore, there is no intention to be bound by any expressed or implied theory presented in the preceding technical field or background, or the following detailed description.

For simplicity and clarity of illustration, the drawing figures illustrate the general manner of construction, and descriptions and details of well-known features and techniques may be omitted to avoid unnecessarily obscuring the description of the embodiments. Additionally, elements in the drawings figures are not necessarily drawn to scale. For example, the dimensions of some of the elements or regions in some of the figures may be exaggerated relative to other elements or regions of the same or other figures to help improve understanding of the various embodiments.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," right," "in," "out," "front," "back," "up," "down," "top," "bottom," "over," "under," "above," "below" and the like in the description and the claims, if any, are used for describing relative positions and not necessarily for describing permanent positions in space. It is to be understood that the embodiments described herein may be used, for example, in other orientations than those illustrated or otherwise described herein. The term "coupled," as used herein, is defined as directly or indirectly connected in an electrical or non-electrical manner.

The various embodiments of the invention described here are illustrated by semiconductor devices and structures of particular conductivity type having various P and N doped regions appropriate for that conductivity type device or structure. But this is merely for convenience of explanation and not intended to be limiting. Persons of skill in the art will understand that devices or structures of opposite conductivity type may be provided by interchanging conductivity types so that a P-type region becomes an N-type region and vice versa. Alternatively, the particular regions illustrated in what follows may be more generally referred to as of a "first conductivity type" and a "second" opposite conductivity type", wherein the first conductivity type may be either N or P type and the second opposite conductivity type is then either P or N type, and so forth. Further, for convenience of explanation and not intended to be limiting, various embodiments of the present invention are described herein for silicon semiconductors, but persons of skill in the art will understand the invention is not limited to silicon but applies to a wide variety of semiconductor materials. Non-limiting examples are other type IV semiconductor materials, as well as type III-V and II-VI semiconductor materials, organic semiconductor materials and combinations thereof, whether in bulk form or in layered form or in thin film form or semiconductor-on-insulator (SOI) form or combinations thereof. Such materials may be single-crystal or poly-crystalline or amorphous or combinations thereof.

FIG. 1 is a simplified diagram of an electronic system 100 that includes a driver circuit 110 configured to drive an external circuit 130 that includes an inductive load 132, according to an embodiment. System 100 may be implemented in an automobile or other vehicle, where the inductive load 132 represents a portion of a motor, or other inductive component of the vehicle. Alternatively, system 100 or derivations thereof may be used in applications other than automotive or vehicular applications.

According to an embodiment, driver circuit 110 is part of a system-on-a-chip (SOC), where the driver circuit 110 and other portions of the SOC are formed on a single semiconductor substrate (referred to below as the "SOC substrate"). For example, the SOC also may include various processing components, memory arrays (e.g., flash arrays, static random access memory (SRAM) arrays, and so on), and other circuitry. For simplicity, other portions of the SOC are not illustrated in FIG. 1. As will be explained in more detail below, embodiments relate to systems and semiconductor components that are configured to reduce undesirable current from being injected into the SOC substrate from the inductive load 132 or other sources.

Driver circuit 110 and other portions of the SOC are coupled with the external circuit 130 via at least "high side gate" (HG) pin 140, "high side source" (HS) pin 141, "low side gate" (LG) pin 142, "low side source" (LS) pin 143, and ground pin 144. Although referred to as "pins" herein, pins 140-144 may include any combination of pins, leads, bumps, balls, or other types of contacts. In FIG. 1, the vertical, dashed line through pins 140-144 represents the division between the SOC (including driver circuit 110) and the external circuit 130.

As mentioned above, external circuit 130 includes an inductive load 132. In addition, external circuit 130 includes a first "high side" FET 133, a second "low side" FET 134, and a shunt resistor 136, in an embodiment. As will be explained in more detail later, under certain circumstances, inductive load 132 may function as a source of injected current, which couples to the driver circuit 110. The high side FET 133 and the low side FET 134 each include a body diode, as shown in FIG. 1. HS pin 141 is coupled to an input terminal of the inductive load 132, the source of high side FET 133, and the drain of low side FET 134 at node 120. The source of low side FET 134 is coupled to LS pin 143 and to ground through shunt resistor 136. The gate of high side FET 133 is coupled to HG pin 140, and high side FET 133 is turned on and off in response to signals received from driver circuit 110 through HG pin 140. The gate of low side FET 134 is coupled to LG pin 142, and low side FET 134 is turned on and off in response to signals received from driver circuit 110 through LG pin 142.

According to an embodiment, driver circuit 110 includes, along a first current path, at least a first N-type LDMOS field effect transistor (NLDMOSFET) 112 and at least a first P-type LDMOSFET (PLDMOSFET) 116. Node 150 couples the drain of NLDMOSFET 112 and the source and body of PLDMOSFET 116 to HG pin 140. Node 151 couples the source and body of NLDMOSFET 112 and the drain of PLDMOSFET 116 to HS pin 141. Along a second current path, driver circuit 110 also may include a second NLDMOSFET 114 and a second PLDMOSFET 118. Node 152 couples the drain of NLDMOSFET 114 and the source and body of PLDMOSFET 118 to LG pin 142. Node 153 couples the source and body of NLDMOSFET 114 and the drain of PLDMOSFET 118 to LS pin 143. The SOC substrate is connected to system ground through ground pin 144.

As will be explained in more detail later in conjunction with the other figures, the active areas of PLDMOSFETs 116 and 118 each may be formed within an isolation structure or isolation "tub" (e.g., an N-type buried layer and N-type sinker region that surrounds the active area). In addition, the active areas of NLDMOSFETS 112 and 114 each similarly may be formed within an isolation structure. The isolation structures are configured to isolate the active areas of NLDMOSFETs 112 and 114 and PLDMOSFETs 116 and 118 from the remainder of the SOC substrate. The isolation structures may allow NLDMOSFETs 112 and 114 and PLDMOSFETs 116 and 118 to operate with a body bias. In addition, the isolation structures may help to prevent current injection into the SOC substrate under normal operating conditions. For example, in FIG. 1, diodes 113 and 115 represent buried layer-to-substrate diodes associated with NLDMOSFETs 112 and 114, and diodes 117 and 119 represent buried layer-to-substrate diodes associated with PLDMOSFETs 116 and 118, where the diodes 113, 115, 117, and 119 allow pins 141-143 to be at positive potentials without shorting to the SOC substrate.

In some systems, the source regions of PLDMOSFETs 116 and 118 and their associated isolation structures are electrically shorted through metallization so that the source regions and the isolation structures always are at a same potential. In addition, in the PLDMOSFETs 116 and 118, the body region may be merged with the isolation structure at or below the substrate surface, in which case the isolation structure (or more specifically the N-type sinker region) may be considered to be a body tie. The source region and body region typically are held at high potentials (e.g., Vdd), and shorting the sources with the isolation structures while merging the isolation structure and the body region enables the portion of the substrate between the body region and the N-type buried layer to better sustain full reverse bias at maximum Vdd. Similarly, the drain regions of NLDMOSFETs 112 and 114 and their associated isolation structures may be electrically shorted through metallization so that the drain regions and the isolation structures always are at a same potential. This arrangement is beneficial because, in the NLDMOSFETs 112 and 114, the substrate material between the drift region and each isolation structure's buried layer may not be able to sustain a full reverse bias at maximum Vdd from both the drift region and the buried layer.

While shorting together the current carrying regions (e.g., drain regions of the NLDMOSFETs 112 and 114, and source regions of the PLDMOSFETs 116 and 118) to the isolation structures of NLDMOSFETs 112 and 114 and the body of PLDMOSFETs 116 and 118, respectively, may work well under many operating conditions, this arrangement may allow undesirable current to be injected into the substrate of the SOC under certain other operating conditions. For example, at the moment that the driver circuit 110 turns the high side FET 133 off (e.g., by turning on NLDMOSFET 112), the low side FET 134 also is off (e.g., NLDMOSFET 114 is conducting). In this state, the current in the inductive load 132 may push the HS pin 141 negative until the body diode of the low side FET 134 is forward biased. The driver circuit 110 may be controlled to turn on the low side FET 134 in order to lower the power dissipation of the low side FET 134 some time later. Then, the negative potential at node 120 and the HS pin 141 (and thus the source and body of NLDMOSFET 112) is defined by the inductive load current times the sum of the resistance of shunt resistor 136 and the RDSON of the low side FET 134. On the LS pin 143 (and the source and body of NLDMOSFET 114), a lesser negative potential is defined by the inductive load current times the resistance of the shunt resistor 136. For a while after the high side FET 133 is turned off, the NLDMOSFETs 112 and 114 have positive gate-source voltages (Vgs), thus causing the drains to short with the sources of NLDMOSFETs 112 and 114. In systems in which the drain electrodes and isolation structures of NLDMOSFETs 112 and 114 are merely shorted, the negative potentials on the HS pin 141 and the LS pin 143 may then access nodes 150, 152 and at least two injecting sites (N-type areas) in the SOC substrate through the conducting channels of NLDMOSFETs 112 and 114. Because the negative potential on the HS pin 141 is greater than the negative potential on the LS pin 143, the potential for current injection as a result of the negative potential on the HS pin 141 is a larger issue than the potential for current injection as a result of the negative potential on the LS pin 143. To avoid the high power dissipation in the body diode of low side FET 134 for an extended period of time, low side FET 134 is turned on (i.e., by turning off NLDMOSFET 114) shortly after the high side FET 133 is turned off. However, the potential at node 120 (and thus HS pin 141) will still be negative, and the issue of current injection may still exist, although to a lesser extent.

According to various embodiments, driver circuit 110 includes further circuitry configured to reduce current injection into the SOC substrate under the above-described or other operating conditions. More particularly, in an embodiment, driver circuit 110 includes a first resistor circuit 160 coupled between the drain region and the isolation structure of NLDMOSFET 112, a second resistor circuit 161 coupled between the drain region and the isolation structure of NLDMOSFET 114, a third resistor circuit 162 coupled between the source region and the isolation structure of PLDMOSFET 116, and a fourth resistor circuit 163 coupled between the source region and the isolation structure of PLDMOSFET 118. By inserting the resistor circuits 160-163 at these locations, the injection current can be reduced. More specifically, the injection sites are moved behind resistor circuits 160-163, thus significantly limiting the current that may be injected into the SOC substrate at a given potential on the HS pin 141 and/or the LS pin 143. Although not illustrated in FIG. 1, driver circuit 110 may include additional NLDMOSFET and/or PLDMOSFET devices, which also include resistor circuits coupled between their drain or source regions and isolation structures for the purpose of reducing current injection into the SOC substrate.

As used herein, a "resistor circuit" is a circuit that includes one or more resistors or resistive networks. When referring to "a resistive network" herein, it is to be understood that the term may include a single resistor or an arrangement of resistors in series or parallel. As will be explained in more detail later, embodiments of "resistor circuits" discussed herein include at least one resistive network, and also may include one or more other components (e.g., one or more diodes or other components in series and/or parallel with the resistive network(s) of the resistor circuit). As will be described in more detail later in conjunction with the remaining figures, a resistor forming a portion of a resistor circuit may be formed from polycrystalline silicon, although it is to be understood that a resistor may be formed from other materials, as well. A "diode" may include a single diode or multiple diodes interconnected in series and/or parallel. In various embodiments, a diode may be formed from a Schottky contact and a doped semiconductor region, a PN junction, a polycrystalline silicon diode, and combinations of these or other diode components.

Embodiments of NLDMOSFETs (e.g., NLDMOSFET 112), PLDMOSFETs (e.g., PLDMOSFET 116) and associated resistor circuits (e.g., resistor circuits 160 and 162) are described in more detail below. More specifically, FIGS. 2-7 discuss various embodiments of NLDMOSFETs and associated resistor circuits, and FIGS. 8-13 discuss various embodiments of PLDMOSFETs and associated resistor circuits. It is to be understood that the various embodiments of NLDMOSFETs and PLDMOSFETs could be incorporated into a system, such as system 100.

Figure 2:
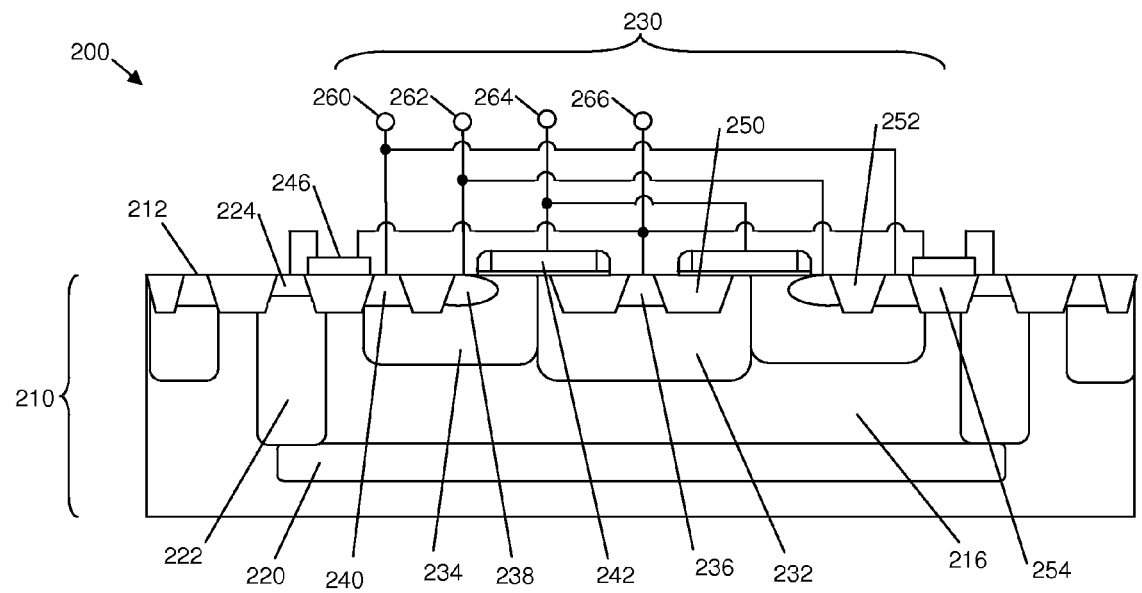
FIG. 2 is a cross-sectional view of an N-type, laterally-diffused metal oxide semiconductor field effect transistor (NLDMOSFET) with a resistor circuit connected between a drain region and an isolation structure of the NLDMOSFET, according to an embodiment.

FIG. 2 is a cross-sectional view of an NLDMOSFET 200 (e.g., NLDMOSFET 112, FIG. 1) with a resistor circuit (e.g., resistor circuit 160, FIG. 1) coupled between a drain region and an isolation structure of NLDMOSFET 200, according to an embodiment. According to an embodiment, various regions of NLDMOSFET 200 (and PLDMOSFET 800, FIG. 8, discussed later) have ring-shaped configurations oriented in planes that are perpendicular to the cross-section illustrated in FIG. 2. Although the figures and description herein particularly apply to a double gate finger configuration, the scope of the inventive subject matter is not limited to such configurations. Those of skill in the art would understand, based on the description herein, how to modify the illustrated and described embodiments to apply to configurations that include multiple (i.e., >2) gate fingers, where adjacent gate fingers may share a drain (e.g., drain region 236) on one side and a body contact region (e.g., body contact region 240) on the other side. In such embodiments, a body contact region may be more laterally separated from the sinker region (e.g., sinker region 222) than is depicted in the figures.

NLDMOSFET 200 is formed in and on a semiconductor substrate 210 (e.g., the SOC substrate discussed in conjunction with FIG. 1), which has a top substrate surface 212. According to an embodiment, NLDMOSFET 200 includes an isolation structure that substantially surrounds a portion 216 of the substrate associated with an active area 230 of the NLDMOSFET 200 (i.e., an area of the substrate 210 within which an active device is formed). In other words, the active device may be considered to be contained by the isolation structure. The isolation structure is a box-type structure, which is formed from an N-type buried layer (NBL) 220 (located at a depth below the top substrate surface 212) and an N-type sinker region 222 extending from the top substrate surface 212 to the depth of the NBL 220. The sinker region 222 may be formed using a single implantation procedure having an implant energy sufficient to enable the sinker region 222 to extend to the NBL 220, or the sinker region 222 may be formed using multiple implantation procedures having different implant energies, thus forming a series of interconnected sinker sub-regions at different depths.

NLDMOSFET 200 further includes an active device formed within the active area 230. According to an embodiment, the active device includes an N-type drift region 232, a P-type body region 234, an N-type drain region 236, an N-type source region 238, a P-type body contact region 240 (also referred to as a "body tie"), and a gate electrode 242 (and corresponding gate dielectric, not numbered). Drain region 236 and source region 238 may be referred to herein as "current carrying regions," to differentiate these regions from the gate of NLDMOSFET 200, which is not a current carrying region. The use of the term "current carrying region," in reference to drain region 236 and source region 238 is not meant to imply that other regions of NLDMOSFET 200 do not carry current. The drift region 232 is formed within a central portion of the active area 230, and extends from the top substrate surface 212 into the substrate 210 to a depth that is less than the depth of NBL 220. The drain region 236 is formed within the drift region 232, and is more heavily doped than the drift region 232. The drain region 236 extends from the top substrate surface 212 into the substrate 210 to a depth significantly less than the depth of the drift region 232. The body region 234 is formed between the drift region 232 and the sinker region 222, and extends from the top substrate surface 212 into the substrate 210 to a depth that is less than the depth of NBL 220, and that may be less than the depth of the drift region 232 (although body region 234 may extend to depths that are substantially equal to or greater than the depth of the drift region 232, as well). In an embodiment, the body region 234 abuts the drift region 232 and is laterally separated from the sinker region 222, as shown in FIG. 2. In alternate embodiments, the body region 234 may be laterally separated from the drift region 232, or the body region 234 may overlap the drift region 232 (creating a region with a dopant profile that differs from that in the channel or drift region 232). The source region 238 and body contact region 240 are formed within the body region 234, each extending from the top substrate surface 212 into the substrate 210 to a depth significantly less than the depth of the body region 234. The source region 238 is of an opposite conductivity type from the body region 234, and may be more heavily doped than the drift region 232, and the body contact region 240 is more heavily doped than the body region 234. A conductive interconnect electrically couples the body contact region 240 to a body contact terminal 260, and an additional conductive interconnect electrically couples the source region 238 to a source terminal 262. Gate electrode 242 is formed over a gate oxide on the top substrate surface 212 generally between the drain region 236 and the source region 238. A conductive interconnect also electrically couples the gate electrode 242 to a gate terminal 264.

According to an embodiment, NLDMOSFET 200 may further include various shallow trench isolation (STI) structures 250, 252, 254, as shown in FIG. 2. For example, at the top substrate surface 212, STI 250 abuts the drain region 236 within drift region 232, STI 252 is positioned between the source region 238 and the body contact region 240, and STI 254 is positioned between the body contact region 240 and the isolation structure (or more specifically, sinker region 222). In alternate embodiments, some or all of STI structures 250, 252, and/or 254 may be excluded. For example, STI 252 may be excluded, and source region 238 and body contact region 240 may be shorted together. In addition, STI 250 may be excluded, making NLDMOSFET 200 an "active drift device," rather than the "field drift device" illustrated in FIG. 2. The inclusion of STI 250 allows for a high gate-to-drain potential while reducing the risk of rupturing the gate oxide. In still other alternate embodiments, some or all of the STI structures may be replaced with a silicide blocking layer that prevents silicide formation at the surface that would otherwise short the various regions together.

According to an embodiment, NLDMOSFET 200 further includes a resistor circuit (e.g., resistor circuit 160, FIG. 1) connected between drain region 236 and an N-type region 224 extending into the sinker region 222, where N-type region 224 is more heavily doped than the sinker region 222 to provide for Ohmic contact to sinker region 222. For example, the resistor circuit may include a resistive network with one or more resistors 246. Although only one resistor 246 is shown in FIG. 2, it is to be understood that a resistive network may include multiple resistors. The resistor(s) 246 of the resistive network may be formed from polycrystalline silicon, and may be located on one or more insulated regions of the top surface of the substrate (e.g., on STI 254). Alternatively, one or more of the resistors 246 may be formed from other materials and/or located elsewhere.

According to an embodiment, a conductive interconnect electrically couples the drain region 236, a first terminal of the resistive network (e.g., a first terminal of resistor 246), and a drain terminal 266. Another conductive interconnect electrically couples a second terminal of the resistive network (e.g., a second terminal of resistor 246) to the isolation structure (e.g., to the N-type region 224). In an embodiment, the resistive network has a resistance in a range of about 10 to about 500 ohms, although smaller or larger resistances may be used, as well.

Figure 3:
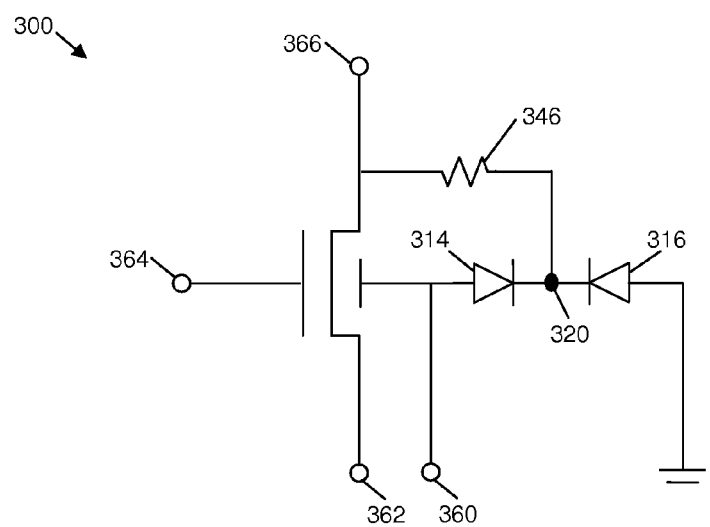
FIG. 3 is a simplified circuit representation of the NLDMOSFET of FIG. 2, according to an embodiment.

FIG. 3 is a simplified circuit representation 300 of the NLDMOSFET 200 of FIG. 2, according to an embodiment. Referring also to FIG. 2, terminal 360 (e.g., terminal 260) is coupled with the P-type body region (e.g., coupled to body region 234 via body contact region 240), terminal 362 (e.g., terminal 262) is coupled with the N-type source region (e.g., source region 238), terminal 364 (e.g., terminal 264) is coupled with the gate electrode (e.g., gate electrode 242), and terminal 366 (e.g., terminal 266) is coupled with the drain region (e.g., drain region 236).

According to an embodiment, and as discussed above, the NLDMOSFET also includes resistive network 346 electrically coupled between the drain region (e.g., drain region 236) and the device's isolation structure. Although a single resistor is used to depict the resistive network 346 in FIG. 3 (and in the other circuit representations depicted in the figures), it is to be understood that this is for convenience only, and that a resistive network may include multiple resistors, as discussed previously. In an embodiment, a first terminal of the resistive network 346 is coupled to the drain region, and a second terminal of the resistive network 346 is coupled to the isolation structure (e.g., the combination of sinker region 222 and NBL 220). At node 320, diode 314 represents the diode formed by the interface between the isolation structure and the portion of the substrate within the active area of the device (e.g., the portion 216 of the substrate 210 within the isolation structure), and diode 316 represents the diode formed by the interface between the isolation structure and the remainder of the substrate outside of the isolation structure.

During normal operation in which the drain potential is elevated, the isolation structure potential closely follows that of the drain region with a voltage drop across resistive network 346 that depends on the amount of current flowing through the isolation structure. On the other hand, when the drain potential transitions to a negative voltage, the isolation structure potential is held up by the voltage drop across the resistive network 346. By holding up the potential of the isolation structure when the drain potential goes negative, carrier injection into the substrate that may otherwise occur if the drain and isolation structure were merely shorted may be reduced, thus avoiding disruption of adjacent circuit blocks.

Figure 4:
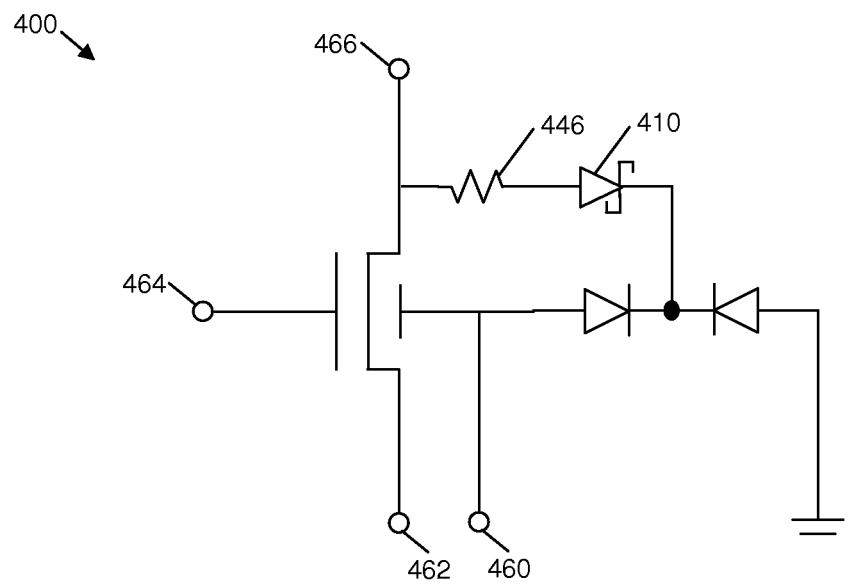
FIG. 4 is a simplified circuit representation of the NLDMOSFET of FIG. 2 with a resistor circuit that includes a resistive network in series with a Schottky diode, according to an alternate embodiment.

According to another embodiment, the resistor circuit (e.g., resistor circuit 160, FIG. 1) may include a resistive network in series with a Schottky diode. For example, FIG. 4 is a simplified circuit representation 400 of the NLDMOSFET 200 of FIG. 2 with a resistor circuit that includes a resistive network 446 in series with a Schottky diode 410, according to an alternate embodiment. Similar to the embodiment of FIG. 3, terminal 460 (e.g., terminal 260) is coupled with the P-type body region (e.g., coupled to body region 234 via body contact region 240), terminal 462 (e.g., terminal 262) is coupled with the N-type source region (e.g., source region 238), terminal 464 (e.g., terminal 264) is coupled with the gate electrode (e.g., gate electrode 242), and terminal 466 (e.g., terminal 266) is coupled with the drain region (e.g., drain region 236).

Schottky diode 410 and resistive network 446 are electrically coupled in series between the drain region (e.g., drain region 236) and the device's isolation structure. Schottky diode 410 may be formed, for example, by a Schottky contact (not illustrated) in contact with the isolation structure (e.g., with sinker region 222). More particularly, in an embodiment, the Schottky diode may be formed from the metal-semiconductor junction between a Schottky contact (e.g., formed with silicide on the top substrate surface) and the top surface of sinker region 222. In an alternate embodiment, the Schottky contact may be formed on a sidewall or other surface that is not co-planar with the top substrate surface 212.

During operation, when the drain potential transitions to a negative voltage, the isolation structure potential is held up by the voltage drop across resistive network 446 in series with the reverse breakdown voltage of the Schottky diode 410. For example, referring again to FIG. 1, during high side turn off in the context of normal operations, the voltage on the drain of the NLDMOSFET (e.g., the voltage on the HS pin 141, FIG. 1) may swing negative between about −0.3 volts and −6.0 volts (or some other normal operating value). According to various embodiments, the resistor circuit (e.g., resistor circuits 160-163, FIG. 1) may include diodes with breakdown voltages that are less than, greater than, or equal to the lowest normal negative operating voltage, depending on the application, so that the diodes will only break down once an excessive negative voltage occurs on the drain (e.g., the reverse breakdown voltage of Schottky diode 410 may be between about −0.3 volts to about −14.0 volts, although smaller or larger reverse breakdown voltages may be achieved, as well). The combination of the Schottky diode 410 and resistive network 446 may allow for more flexibility in the construction of the Schottky diode 410. In addition, in choosing a value for resistive network 446 to achieve optimum overall results in maintaining the NLDMOSFET's integrity, electrostatic discharge (ESD) robustness may be achieved while reducing substrate injection. More specifically, for example, under conditions in which the Schottky diode 410 is run into breakdown (e.g., during ESD stress), the current through the Schottky diode 410 is limited by resistive network 446 to the extent of its capability, thus reducing the likelihood that an ESD event may damage Schottky diode 410.

Figure 5:
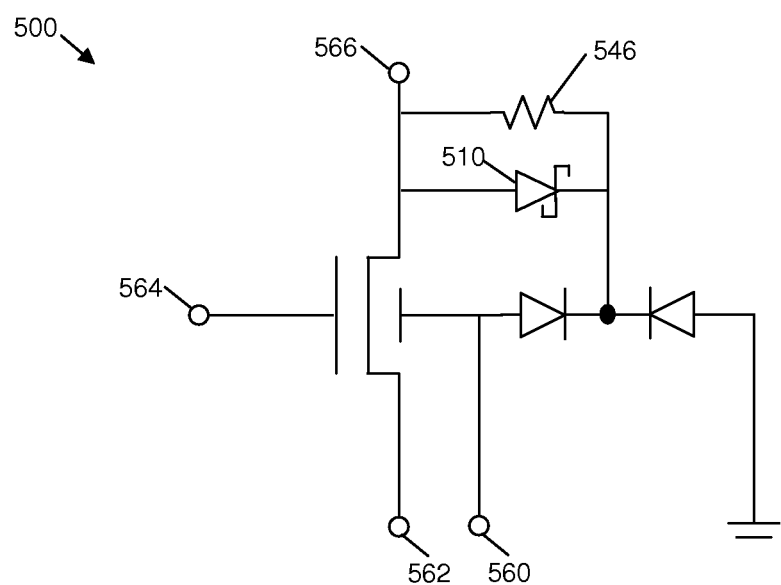
FIG. 5 is a simplified circuit representation of the NLDMOSFET of FIG. 2 with a resistor circuit that includes a resistive network in parallel with a Schottky diode, according to another alternate embodiment.

According to yet another embodiment, the resistor circuit (e.g., resistor circuit 160, FIG. 1) may include a resistive network in parallel with a Schottky diode. For example, FIG. 5 is a simplified circuit representation 500 of the NLDMOSFET 200 of FIG. 2 with a resistor circuit that includes a resistive network 546 in parallel with a Schottky diode 510, according to an alternate embodiment. Similar to the embodiment of FIG. 2, terminal 560 (e.g., terminal 260) is coupled with the P-type body region (e.g., coupled to body region 234 via body contact region 240), terminal 562 (e.g., terminal 262) is coupled with the N-type source region (e.g., source region 238), terminal 564 (e.g., terminal 264) is coupled with the gate electrode (e.g., gate electrode 242), and terminal 566 (e.g., terminal 266) is coupled with the drain region (e.g., drain region 236).

Schottky diode 510 (e.g., the interface between a Schottky contact (not illustrated) and sinker region 222) and resistive network 546 are electrically coupled in parallel between the drain region (e.g., drain region 236) and the device's isolation structure. During operation, when the drain potential transitions to a negative voltage, the isolation structure potential is held up by the voltage drop across resistive network 546 in parallel with the reverse breakdown voltage of the Schottky diode 510. As with the resistor circuit discussed in conjunction with FIG. 4, the combination of the Schottky diode 510 and resistive network 546 may allow for more flexibility in the construction of the Schottky diode 510. In addition, resistive network 546 may function to maintain the potential of the isolation structure closer to the drain potential of the NLDMOSFET, under certain circumstances. For example, when the drain potential is falling (although still positive), the potential of the isolation structure is pulled down only by the capacitance of Schottky diode 510, which may or may not be sufficient. In such a case, resistive network 546 may help to discharge the potential of the isolation structure towards the drain potential. Although some minority carrier injection may be added when the drain potential transitions negative, resistive network 546 may limit the amount of carrier injection.

In the embodiments discussed in conjunction with FIGS. 4 and 5, a resistor circuit (e.g., resistor circuit 160, FIG. 1) includes a resistive network (e.g., resistive networks 446, 546) coupled in series (FIG. 4) or in parallel (FIG. 5) with a Schottky diode. In another alternate embodiment, a resistor circuit may include a Schottky diode and both a first resistive network coupled in series and a second resistive network coupled in parallel with the Schottky diode, in order to realize the advantages that may be provided by both the series-coupled and parallel-coupled resistive network arrangements.

In the embodiments discussed in conjunction with FIGS. 4 and 5, a resistor circuit (e.g., resistor circuit 160, FIG. 1) coupling the drain region and isolation structure of an embodiment of an NLDMOSFET (e.g., NLDMOSFET 112, FIG. 1) includes a Schottky diode. According to another embodiment, a resistor circuit (e.g., resistor circuit 160, FIG. 1) includes a resistive network and a PN junction diode (not illustrated) connected between the drain region (e.g., drain region 236, FIG. 2) and the isolation structure. For example, referring again to FIG. 2, instead of including N-type region 224, NLDMOSFET 200 may also include a P-type region (not illustrated) extending into sinker region 222. The PN junction between the P-type region and the sinker region 222 forms a PN junction diode, which may be interconnected within the resistor circuit. The PN junction diode can be designed to provide a desired application-dependent breakdown voltage (e.g., a breakdown voltage greater than, less than, or equal to the normal, most negative operating voltage). For example, in an embodiment, the PN junction diode may be designed to provide a reverse breakdown voltage in a range of about −0.3 volts to about −14.0 volts, although smaller or larger breakdown voltages may be achieved, as well.

According to yet another embodiment, a resistor circuit (e.g., resistor circuit 160, FIG. 1) may include a resistive network and a polycrystalline silicon diode (not illustrated) connected between the drain region (e.g., drain region 236, FIG. 2) and the isolation structure. For example, a polycrystalline silicon diode may be formed from a P-type region and an N-type region separated by a neutral spacer region that defines the breakdown voltage of polycrystalline silicon diode. The polycrystalline silicon diode may be formed on an insulated region of the top surface of the substrate (e.g., on STI 254). Alternatively, the polycrystalline silicon diode may be formed from other materials and/or located elsewhere. In an embodiment, the polycrystalline silicon diode may be designed to provide a desired application-dependent reverse breakdown voltage that is less than, greater than, or equal to the normal, most negative operating voltage (e.g., in a range of about −0.3 volts to about −14.0 volts, although smaller or larger breakdown voltages may be achieved, as well).

Figure 6:
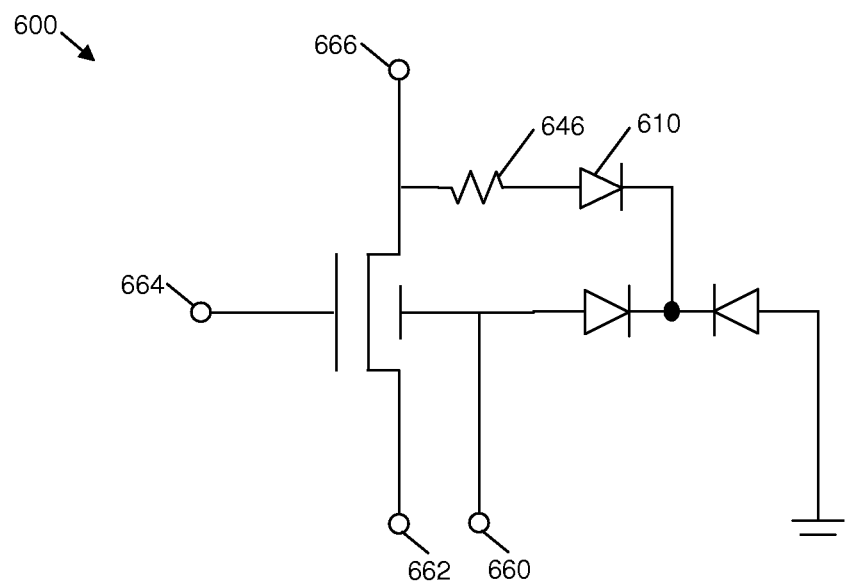
FIG. 6 is a simplified circuit representation of the NLDMOSFETs of FIG. 2 with a resistor circuit that includes a resistive network in series with a PN junction diode, according to an alternate embodiment.

FIG. 6 is a simplified circuit representation 600 of the NLDMOSFET 200 of FIG. 2 with a resistor circuit that includes a resistive network 646 in series with a PN junction diode 610 (e.g., a PN junction diode formed from a PN junction between a P-type region and the sinker region 222, or a polycrystalline silicon diode), according to an alternate embodiment. Similar to the embodiment of FIG. 2, terminal 660 (e.g., terminal 260) is coupled with the P-type body region (e.g., coupled to body region 234 via body contact region 240), terminal 662 (e.g., terminal 262) is coupled with the N-type source region (e.g., source region 238), terminal 664 (e.g., terminal 264) is coupled with the gate electrode (e.g., gate electrode 242), and terminal 666 (e.g., terminal 266) is coupled with the drain region (e.g., drain region 236).

Resistive network 646 and PN junction diode 610 are electrically coupled in series between the drain region (e.g., drain region 236) and the device's isolation structure. During operation, when the drain potential transitions to a negative voltage, the isolation structure potential is held up by the voltage drop across resistive network 646 in series with the reverse breakdown voltage of the PN junction diode 610. As with the embodiment previously discussed in conjunction with FIG. 4, the combination of the PN junction diode 610 and resistive network 646 may provide certain advantageous effects.

Figure 7:
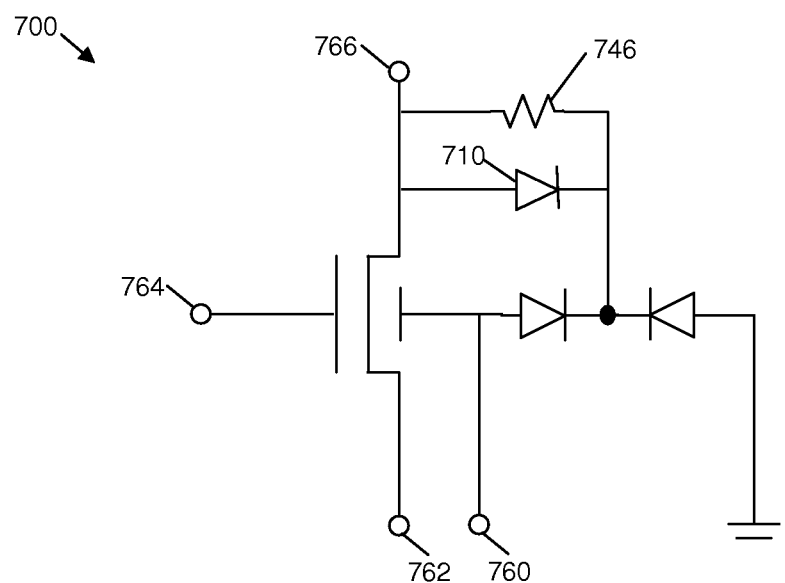
FIG. 7 is a simplified circuit representation of the NLDMOSFETs of FIG. 2 with a resistor circuit that includes a resistive network in parallel with a PN junction diode, according to another alternate embodiment.

According to yet another embodiment, the resistor circuit (e.g., resistor circuit 160, FIG. 1) may include a resistive network in parallel with a PN junction diode. For example, FIG. 7 is a simplified circuit representation 700 of the NLDMOSFET 200 of FIG. 2 with a resistor circuit that includes a resistive network 746 in parallel with a PN junction diode 710, according to an alternate embodiment. Similar to the embodiment of FIG. 2, terminal 760 (e.g., terminal 260) is coupled with the P-type body region (e.g., coupled to body region 234 via body contact region 240), terminal 762 (e.g., terminal 262) is coupled with the N-type source region (e.g., source region 238), terminal 764 (e.g., terminal 264) is coupled with the gate electrode (e.g., gate electrode 242), and terminal 766 (e.g., terminal 266) is coupled with the drain region (e.g., drain region 236).

Resistive network 746 and PN junction diode 710 are electrically coupled in parallel between the drain region (e.g., drain region 236) and the device's isolation structure. During operation, when the drain potential transitions to a negative voltage, the isolation structure potential is held up by the voltage drop across resistive network 746 in parallel with the reverse breakdown voltage of the PN junction diode 710. As with the resistor circuit discussed in conjunction with FIG. 5, the combination of the PN junction diode 710 and resistive network 746 may have certain advantageous effects.

In the embodiments discussed in conjunction with FIGS. 6 and 7, a resistor circuit (e.g., resistor circuit 160, FIG. 1) includes a PN junction diode (e.g., PN junction diodes 610, 710) and either a resistive network coupled in series (resistive network 646) or a resistive network coupled in parallel (resistive network 746) with the PN junction diode. In another alternate embodiment, a resistor circuit may include a PN junction diode and both a first resistive network coupled in series and a second resistive network coupled in parallel with the PN junction diode, in order to realize the advantages that may be provided by both the series-coupled and parallel-coupled resistive network arrangements.

In the embodiments discussed in conjunction with FIGS. 4-7, a resistor circuit (e.g., resistor circuit 160, FIG. 1) coupling the drain region and isolation structure of an embodiment of an NLDMOSFET (e.g., NLDMOSFET 112, FIG. 1) includes either a Schottky diode or a PN junction diode. According to other embodiments, a resistor circuit coupling the drain region and isolation structure of an embodiment of an NLDMOSFET instead may include a combination of one or more Schottky diodes and one or more PN junction diodes. For example, an embodiment of an NLDMOSFET may include a combination of a Schottky diode and one or more PN junction diodes connected in parallel between the drain region and the isolation structure. More particularly, the resistor circuit may include a Schottky diode formed from a metal-semiconductor junction between a Schottky contact and the isolation structure (e.g., sinker region 222), along with one or more P-type regions, each extending into the sinker region and partially across the sinker region. The Schottky contact is connected to the resistive network (i.e., the anode of the Schottky diode is connected to the resistive network), and the PN junction(s) between the P-type region(s) and the sinker region form the PN junction diode(s) of the resistor circuit. According to an embodiment, placing the PN diode(s) alongside the Schottky diode allows the PN junction(s) to deplete the silicon under the Schottky diode, thus reducing reverse-biased leakage in the Schottky diode. The Schottky diode and the PN junction diode(s) can be designed to provide a desired application-dependent breakdown voltage (e.g., a breakdown voltage greater than, less than, or equal to the normal, most negative operating voltage). For example, in an embodiment, the Schottky diode and the PN junction diode(s) each may be designed to provide a reverse breakdown voltage in a range of about −0.3 volts to about −14.0 volts, although smaller or larger breakdown voltages may be achieved, as well.

Figure 8:
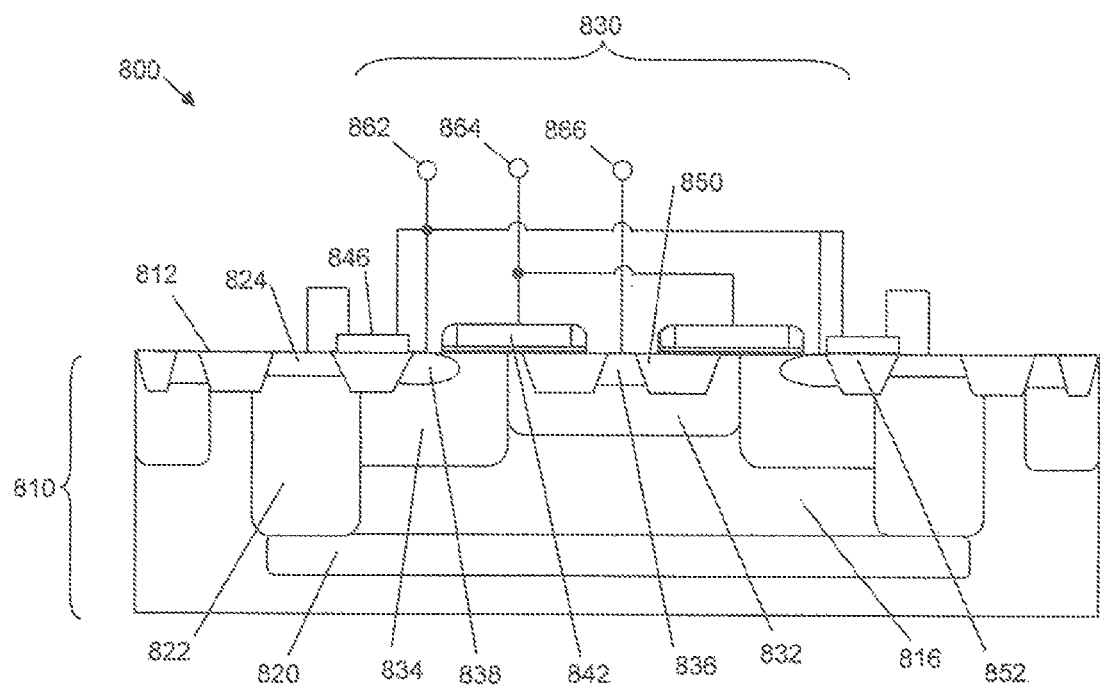
FIG. 8 is a cross-sectional view of a P-type, laterally-diffused metal oxide semiconductor field effect transistor (PLDMOSFET) with a resistor circuit connected between a source region and an isolation structure of the PLDMOSFET, according to an embodiment.

In the above described embodiments, the drain region and isolation structure of an NLDMOSFET (e.g., NLDMOSFET 112, 200, FIGS. 1, 2) are electrically coupled through a resistor circuit. In other embodiments, the source region and isolation structure of a PLDMOSFET (e.g., PLDMOSFET 116, FIG. 1) are electrically coupled through a resistor circuit. For example, FIG. 8 is a cross-sectional view of a PLDMOSFET 800 (e.g., PLDMOSFET 116, FIG. 1) with a resistor circuit (e.g., resistor circuit 162, FIG. 1) coupled between a source region and isolation structure of the PLDMOSFET, according to an embodiment. According to an embodiment, various regions of PLDMOSFET 800 have ring-shaped configurations oriented in planes that are perpendicular to the cross-section illustrated in FIG. 8. Once again, although the figures and description herein particularly apply to a double gate finger configuration, the scope of the inventive subject matter is not limited to such configurations. Those of skill in the art would understand, based on the description herein, how to modify the illustrated and described embodiments to apply to configurations that include multiple (i.e., >2) gate fingers, where adjacent gate fingers may share a drain (e.g., drain region 836).

PLDMOSFET 800 is formed in and on a P-type semiconductor substrate 810 (e.g., the SOC substrate discussed in conjunction with FIG. 1), which has a top substrate surface 812. According to an embodiment, PLDMOSFET 800 includes an isolation structure that substantially surrounds a portion 816 of the substrate associated with an active area 830 of the PLDMOSFET 800 (i.e., an area of the substrate 810 within which an active device is formed). In other words, the active device may be considered to be contained by the isolation structure. The isolation structure is a box-type structure, which is formed from an N-type buried layer (NBL) 820 (located at a depth below the top substrate surface 812) and an N-type sinker region 822 extending from the top substrate surface 812 to the depth of the NBL 820. The sinker region 822 may be formed using a single implantation procedure having an implant energy sufficient to enable the sinker region 822 to extend to the NBL 820, or the sinker region 822 may be formed using multiple implantation procedures having different implant energies, thus forming a series of interconnected sinker sub-regions at different depths.

PLDMOSFET 800 further includes an active device formed within the active area 830. According to an embodiment, the active device includes a P-type drift region 832, an N-type body region 834, a P-type drain region 836, a P-type source region 838, and a gate electrode 842 (and corresponding gate dielectric, not numbered). The drift region 832 is formed within a central portion of the active area 830, and extends from the top substrate surface 812 into the substrate 810 to a depth that is less than the depth of NBL 820. The drain region 836 is formed within the drift region 832, and is more heavily doped than the drift region 832. The drain region 836 extends from the top substrate surface 812 into the substrate 810 to a depth significantly less than the depth of the drift region 832. A conductive interconnect electrically couples the drain region 836 to a drain terminal 866.

The body region 834 is formed between the drift region 832 and the sinker region 822, and extends from the top substrate surface 812 into the substrate 810 to a depth that is less than the depth of NBL 820, and that may be greater than the depth of the drift region 832 (although body region 834 may extend to depths that are less than or substantially equal to the depth of the drift region 832, as well). In an embodiment, the body region 834 abuts the drift region 832. In addition, the body region 834 is merged with the sinker region 822, in an embodiment, as shown in FIG. 8. Accordingly, the isolation structure (or more specifically the sinker region 822) may be considered to be a body tie. In alternate embodiments, the body region 834 may be laterally separated from the drift region 832 and/or the sinker region 822 (e.g., as in the embodiment of FIG. 15), or the body region 834 may overlap the drift region 832 and/or the sinker region 822 (creating regions with dopant profiles that differ from that in the channel or drift region 832 and/or the sinker region 822). The source region 838 is formed within the body region 834, extending from the top substrate surface 812 into the substrate 810 to a depth significantly less than the depth of the body region 834. The source region 838 is more heavily doped than the drift region 832. Gate electrode 842 is formed over a gate oxide on the top substrate surface 812 generally between the drain region 836 and the source region 838. A conductive interconnect electrically couples the gate electrode 842 to a gate terminal 864.

According to an embodiment, PLDMOSFET 800 may further include various STI structures 850, 852, as shown in FIG. 8. For example, at the top substrate surface 812, STI 850 abuts the drain region 836 within drift region 832, and STI 852 is positioned between the source region 838 and the isolation structure (or more specifically, sinker region 822). In alternate embodiments, either or both of STI structures 850 and/or 852 may be excluded. For example, STI 852 may be excluded, and source region 838 and sinker region 822 may be shorted together. In addition, STI 850 may be excluded, making PLDMOSFET 800 an "active drift device," rather than the "field drift device" illustrated in FIG. 8. The inclusion of STI 850 allows for a high gate-to-drain potential while reducing the risk of rupturing the gate oxide. In still other alternate embodiments, some or all of the STI structures may be replaced with a silicide blocking layer.

According to an embodiment, PLDMOSFET 800 further includes a resistor circuit (e.g., resistor circuit 162, FIG. 1) connected between source region 838 and an N-type region 824 extending into the sinker region 822, where N-type region 824 is more heavily doped than the sinker region 822 to provide for Ohmic contact to sinker region 822. For example, the resistor circuit may include a resistive network with one or more resistors 846. Although only one resistor 846 is shown in FIG. 8, it is to be understood that a resistive network may include multiple resistors. The resistor(s) 846 of the resistive network may be formed from polycrystalline silicon, and may be located on one or more insulated regions of the top surface of the substrate (e.g., on STI 852). Alternatively, one or more of the resistors 846 may be formed from other materials and/or located elsewhere. According to an embodiment, a conductive interconnect electrically couples the source region 838, a first terminal of the resistive network (e.g., a first terminal of resistor 846), and a source terminal 862. Another conductive interconnect electrically couples a second terminal of the resistive network (e.g., a second terminal of resistor 846) to the isolation structure (e.g., to the N-type region 824). In an embodiment, the resistive network has a resistance in a range of about 10 to about 500 ohms, although smaller or larger resistances may be used, as well.

As mentioned above, according to an alternate embodiment, the body region (e.g., body region 1534, FIG. 15) may be laterally separated from the sinker region (e.g., sinker region 1522, FIG. 15) so that a P-type gap is present between the body region and the sinker region (e.g., as in the embodiment of FIG. 15, discussed later). In addition, an STI structure (e.g., STI structure 1554, FIG. 15) or silicide blocking layer may be included at the substrate surface to ensure isolation between the regions. The P-type gap may be formed from a portion (e.g., portion 1537, FIG. 15) of the P-type substrate (e.g., portion 1516 of substrate 1510, FIG. 15) within the isolation structure (which would extend toward the top substrate surface between the body region and the sinker region), or from a P-type well region extending from the top substrate surface and located between the body region and the sinker region. In such embodiments, a PLDMOSFET (e.g., PLDMOSFET 1500, FIG. 15) may further include an N-type body contact region (e.g., body contact region 1535, FIG. 15) formed within the body region (e.g., between the source region and the sinker region, where the body contact region may be separated from the source region by an STI structure or silicide blocking layer). The body contact region and the source region (e.g., source region 1538, FIG. 15) may be electrically coupled (shorted) through a conductive interconnect, and the resistor circuit (e.g., resistor circuit 1462, FIG. 14) may be electrically coupled between the isolation structure (e.g., sinker region 1522, FIG. 15) and the shorted source and body regions. During normal operation, when the body region, source region, and isolation structure all are at high potentials, the isolation structure and body region can be effectively shorted through the lateral depletion of the P-type gap between them (e.g., which may be completely depleted before breakdown between them), or through the vertical depletion of the portion of the P-type substrate between the body region and the NBL (e.g., NBL 1520, FIG. 15), whichever comes first.

Figure 9:
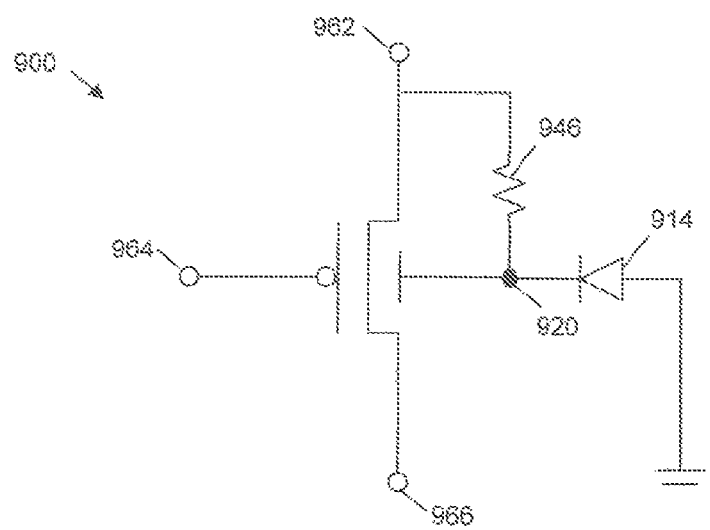
FIG. 9 is a simplified circuit representation of the PLDMOSFET of FIG. 8, according to an embodiment.

FIG. 9 is a simplified circuit representation 900 of the PLDMOSFET 800 of FIG. 8, according to an embodiment. Referring also to FIG. 8, terminal 962 (e.g., terminal 862) is coupled with the source region (e.g., source region 838), terminal 964 (e.g., terminal 864) is coupled with the gate electrode (e.g., gate electrode 842), and terminal 966 (e.g., terminal 866) is coupled with the drain region (e.g., drain region 836).

According to an embodiment, and as discussed above, the PLDMOSFET also includes resistive network 946 electrically coupled between the source region (e.g., source region 838) and the device's isolation structure. Although a single resistor is used to depict the resistive network 946 in FIG. 9 (and in the other circuit representations depicted in the figures), it is to be understood that this is for convenience only, and that a resistive network may include multiple resistors, as discussed previously. In an embodiment, a first terminal of the resistive network 946 is coupled to the source region, and a second terminal of the resistive network 946 is coupled to the isolation structure (e.g., the combination of sinker region 822 and NBL 820). At node 920, diode 914 represents the diode formed by the interface between the isolation structure and the remainder of the substrate outside of the isolation structure.

During normal operation in which the source potential is elevated, the isolation structure potential closely follows that of the source region with a voltage drop across resistive network 946 that depends on the amount of current flowing through the body region. On the other hand, when the source potential transitions to a negative voltage, the isolation structure potential is held up by the voltage drop across the resistive network 946. By holding up the potential of the isolation structure when the source potential goes negative, carrier injection into the substrate that may otherwise occur if the source and isolation structure were merely shorted may be reduced, thus avoiding disruption of adjacent circuit blocks.

Figure 10:
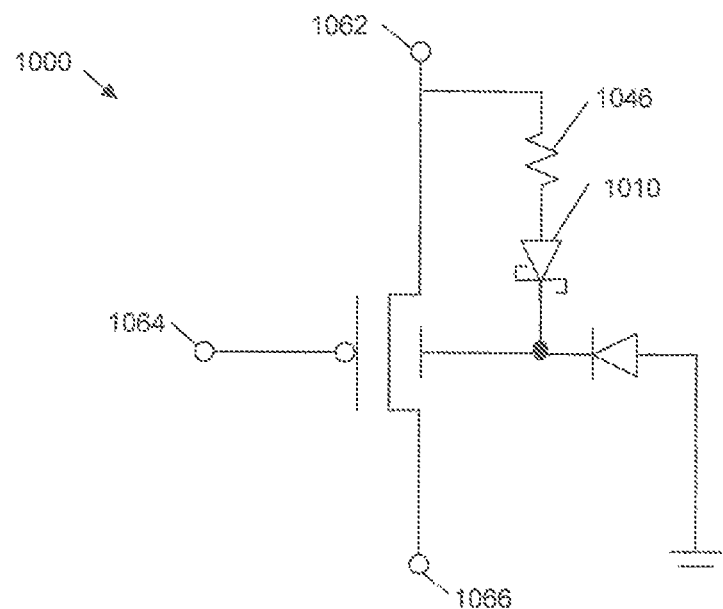
FIG. 10 is a simplified circuit representation of the PLDMOSFET of FIG. 8 with a resistor circuit that includes a resistive network in series with a Schottky diode, according to an alternate embodiment.

According to another embodiment, the resistor circuit (e.g., resistor circuit 162, FIG. 1) may include a resistive network in series with a Schottky diode. For example, FIG. 10 is a simplified circuit representation 1000 of the PLDMOSFET 800 of FIG. 8 with a resistor circuit that includes a resistive network 1046 in series with a Schottky diode 1010, according to an alternate embodiment. Similar to the embodiment of FIG. 8, terminal 1062 (e.g., terminal 862) is coupled with the source region (e.g., source region 838), terminal 1064 (e.g., terminal 864) is coupled with the gate electrode (e.g., gate electrode 842), and terminal 1066 (e.g., terminal 866) is coupled with the drain region (e.g., drain region 836).

Schottky diode 1010 and resistive network 1046 are electrically coupled in series between the source region (e.g., source region 838) and the device's isolation structure. Schottky diode 1010 may be formed, for example, by a Schottky contact (not illustrated) in contact with the isolation structure (e.g., with sinker region 822). More particularly, in an embodiment, the Schottky diode may be formed from the metal-semiconductor junction between a Schottky contact (e.g., formed with silicide on the top substrate surface) and the top surface of sinker region 822. In an alternate embodiment, the Schottky contact may be formed on a sidewall or other surface that is not co-planar with the top substrate surface 812.

During operation, when the source potential transitions to a negative voltage, the isolation structure potential is held up by the voltage drop across resistive network 1046 in series with the reverse breakdown voltage of the Schottky diode 1010. The combination of the Schottky diode 1010 and resistive network 1046 may allow for more flexibility in the construction of the Schottky diode 1010. In addition, in choosing a value for resistive network 1046 to achieve optimum overall results in maintaining the PLDMOSFET's integrity, ESD robustness may be achieved while reducing substrate injection. More specifically, for example, under conditions in which the Schottky diode 1010 is run into breakdown (e.g., during ESD stress), the current through the Schottky diode 1010 is limited by resistive network 1046 to the extent of its capability, thus reducing the likelihood that an ESD event may damage Schottky diode 1010.

Figure 11:
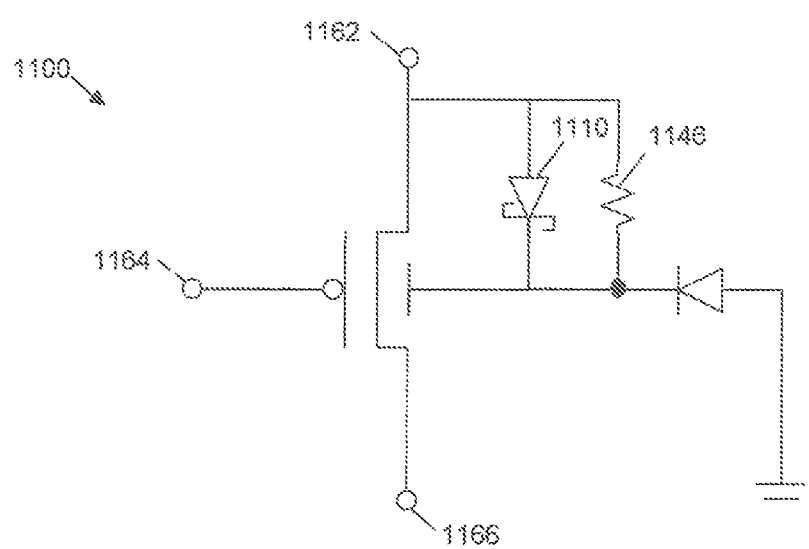
FIG. 11 is a simplified circuit representation of the PLDMOSFET of FIG. 8 with a resistor circuit that includes a resistive network in parallel with a Schottky diode, according to another alternate embodiment.

According to yet another embodiment, the resistor circuit (e.g., resistor circuit 162, FIG. 1) may include a resistive network in parallel with a Schottky diode. For example, FIG. 11 is a simplified circuit representation 1100 of the PLDMOSFET 800 of FIG. 8 with a resistor circuit that includes a resistive network 1146 in parallel with a Schottky diode 1110, according to an alternate embodiment. Similar to the embodiment of FIG. 8, terminal 1162 (e.g., terminal 862) is coupled with the source region (e.g., source region 838), terminal 1164 (e.g., terminal 864) is coupled with the gate electrode (e.g., gate electrode 842), and terminal 1166 (e.g., terminal 866) is coupled with the drain region (e.g., drain region 836).

Schottky diode 1110 (e.g., the interface between a Schottky contact (not illustrated) and sinker region 822) and resistive network 1146 are electrically coupled in parallel between the source region (e.g., source region 838) and the device's isolation structure. During operation, when the source potential transitions to a negative voltage, the isolation structure potential is held up by the voltage drop across resistive network 1146 in parallel with the reverse breakdown voltage of the Schottky diode 1110. As with the resistor circuit discussed in conjunction with FIG. 10, the combination of the Schottky diode 1110 and resistive network 1146 may allow for more flexibility in the construction of the Schottky diode 1110. In addition, resistive network 1146 may function to maintain the potential of the isolation structure closer to the drain potential of the PLDMOSFET, under certain circumstances. For example, when the source potential is falling (although still positive), the potential of the isolation structure is pulled down only by the capacitance of Schottky diode 1110, which may or may not be sufficient. In such a case, resistive network 1146 may help to discharge the potential of the isolation structure towards the source potential. Although some minority carrier injection may be added when the source potential transitions negative, resistive network 1146 may limit the amount of carrier injection.

In the embodiments discussed in conjunction with FIGS. 10 and 11, a resistor circuit (e.g., resistor circuit 162, FIG. 1) includes a resistive network (e.g., resistive networks 1046, 1146) coupled in series (FIG. 10) or in parallel (FIG. 11) with a Schottky diode. In another alternate embodiment, a resistor circuit may include a Schottky diode and both a first resistive network coupled in series and a second resistive network coupled in parallel with the Schottky diode, in order to realize the advantages that may be provided by both the series-coupled and parallel-coupled resistive network arrangements.

In the embodiments discussed in conjunction with FIGS. 10 and 11, a resistor circuit (e.g., resistor circuit 162, FIG. 1) coupling the source region and isolation structure of an embodiment of a PLDMOSFET (e.g., PLDMOSFET 116, FIG. 1) includes a Schottky diode. According to another embodiment, a resistor circuit (e.g., resistor circuit 162, FIG. 1) includes a resistive network and a PN junction diode (not illustrated) connected between the source region (e.g., source region 838, FIG. 8) and the isolation structure. For example, referring again to FIG. 8, instead of including N-type region 824, PLDMOSFET 800 may also include a P-type region (not illustrated) extending into sinker region 822, where the P-type region is more heavily doped than P-type drift region 832. The PN junction between the P-type region and the sinker region 822 forms a PN junction diode, which may be interconnected within the resistor circuit. The PN junction diode can be designed to provide a desired application-dependent breakdown voltage (e.g., a breakdown voltage greater than, less than, or equal to the normal, most negative operating voltage). For example, in an embodiment, the PN junction diode may be designed to provide a reverse breakdown voltage in a range of about −0.3 volts to about −14.0 volts, although smaller or larger breakdown voltages may be achieved, as well.

According to yet another embodiment, a resistor circuit (e.g., resistor circuit 162, FIG. 1) may include a resistive network and a polycrystalline silicon diode (not illustrated) connected between the source region (e.g., source region 838, FIG. 8) and the isolation structure. For example, a polycrystalline silicon diode may be formed from a P-type region and an N-type region separated by a neutral spacer region that defines the breakdown voltage of polycrystalline silicon diode. The polycrystalline silicon diode may be formed on an insulated region of the top surface of the substrate (e.g., on STI 852). Alternatively, the polycrystalline silicon diode may be formed from other materials and/or located elsewhere. In an embodiment, the polycrystalline silicon diode may be designed to provide a desired application-dependent reverse breakdown voltage that is less than, greater than, or equal to the normal, most negative operating voltage (e.g., in a range of about −0.3 volts to about −14.0 volts, although smaller or larger breakdown voltages may be achieved, as well).

Figure 12:
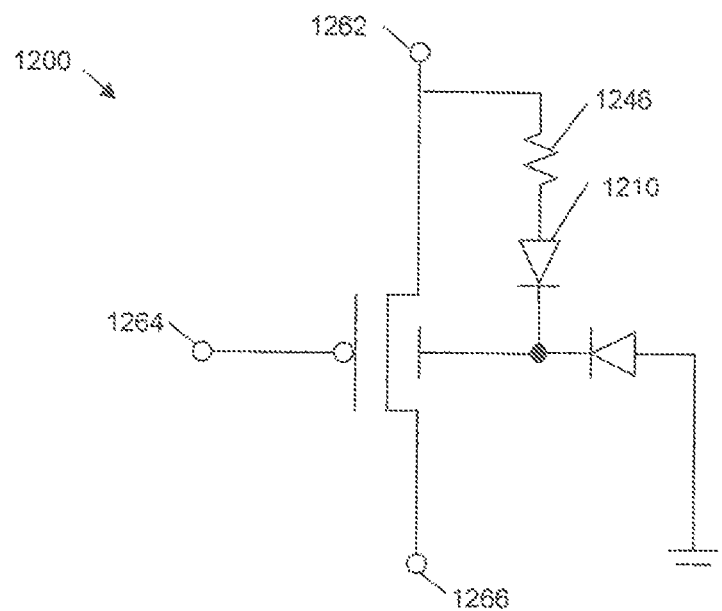
FIG. 12 is a simplified circuit representation of the PLDMOSFETs of FIG. 8 with a resistor circuit that includes a resistive network in series with a PN junction diode, according to an alternate embodiment.

FIG. 12 is a simplified circuit representation 1200 of the PLDMOSFET 800 of FIG. 8 with a resistor circuit that includes a resistive network 1246 in series with a PN junction diode 1210 (e.g., a PN junction diode formed from a PN junction between a P-type region and the sinker region 822, or a polycrystalline silicon diode), according to an alternate embodiment. Similar to the embodiment of FIG. 8, terminal 1262 (e.g., terminal 862) is coupled with the source region (e.g., source region 838), terminal 1264 (e.g., terminal 864) is coupled with the gate electrode (e.g., gate electrode 842), and terminal 1266 (e.g., terminal 866) is coupled with the drain region (e.g., drain region 836).

Resistive network 1246 and PN junction diode 1210 are electrically coupled in series between the source region (e.g., source region 838) and the device's isolation structure. During operation, when the source potential transitions to a negative voltage, the isolation structure potential is held up by the voltage drop across resistive network 1246 in series with the reverse breakdown voltage of the PN junction diode 1210. As with the embodiment previously discussed in conjunction with FIG. 10, the combination of the PN junction diode 1210 and resistive network 1246 may provide certain advantageous effects.

According to yet another embodiment, the resistor circuit (e.g., resistor circuit 162, FIG. 1) may include a resistive network in parallel with a PN junction diode. For example, FIG. 13 is a simplified circuit representation 1300 of the PLDMOSFET 800 of FIG. 8 with a resistor circuit that includes a resistive network 1346 in parallel with a PN junction diode 1310, according to an alternate embodiment.

Similar to the embodiment of FIG. 8, terminal 1362 (e.g., terminal 862) is coupled with the source region (e.g., source region 838), terminal 1364 (e.g., terminal 864) is coupled with the gate electrode (e.g., gate electrode 842), and terminal 1366 (e.g., terminal 866) is coupled with the drain region (e.g., drain region 836).

Resistive network 1346 and PN junction diode 1310 are electrically coupled in parallel between the source region (e.g., source region 836) and the device's isolation structure. During operation, when the source potential transitions to a negative voltage, the isolation structure potential is held up by the voltage drop across resistive network 1346 in parallel with the reverse breakdown voltage of the PN junction diode 1310. As with the resistor circuit discussed in conjunction with FIG. 12, the combination of the PN junction diode 1310 and resistive network 1346 may have certain advantageous effects.

Figure 13:
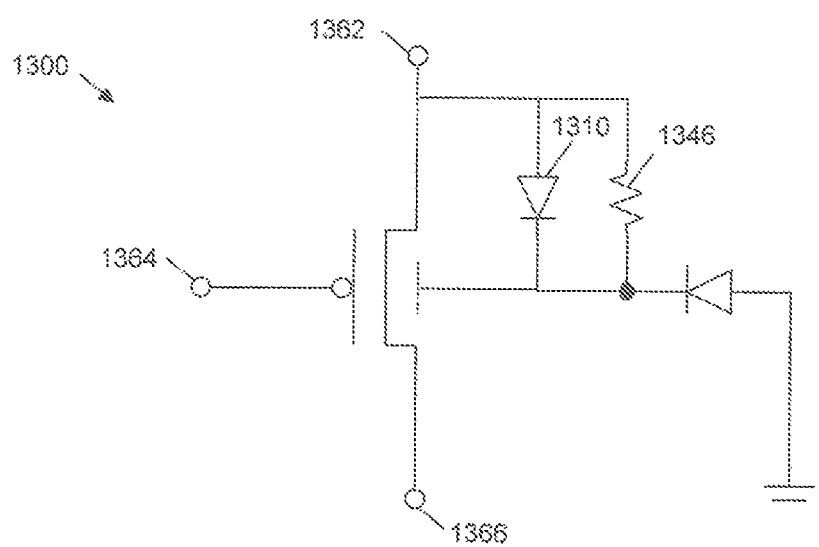
FIG. 13 is a simplified circuit representation of the PLDMOSFETs of FIG. 8 with a resistor circuit that includes a resistive network in parallel with a PN junction diode, according to another alternate embodiment.

In the embodiments discussed in conjunction with FIGS. 12 and 13, a resistor circuit (e.g., resistor circuit 162, FIG. 1) includes a PN junction diode (e.g., PN junction diodes 1210, 1310) and either a resistive network coupled in series (resistive network 1246) or a resistive network coupled in parallel (resistive network 1346) with the PN junction diode. In another alternate embodiment, a resistor circuit may include a PN junction diode and both a first resistive network coupled in series and a second resistive network coupled in parallel with the PN junction diode, in order to realize the advantages that may be provided by both the series-coupled and parallel-coupled resistive network arrangements.

In the embodiments discussed in conjunction with FIGS. 10-13, a resistor circuit (e.g., resistor circuit 162, FIG. 1) coupling the source region and isolation structure of an embodiment of an PLDMOSFET (e.g., PLDMOSFET 116, FIG. 1) includes either a Schottky diode or a PN junction diode. According to other embodiments, a resistor circuit coupling the source region and isolation structure of an embodiment of a PLDMOSFET instead may include a combination of one or more Schottky diodes and one or more PN junction diodes. For example, an embodiment of a PLDMOSFET may include a combination of a Schottky diode and one or more PN junction diodes connected in parallel between the source region and the isolation structure. More particularly, the resistor circuit may include a Schottky diode formed from a metal-semiconductor junction between a Schottky contact and the isolation structure (e.g., sinker region 822), along with one or more P-type regions, each extending into the sinker region and partially across the sinker region. The Schottky contact is connected to the resistive network (i.e., the anode of the Schottky diode is connected to the resistive network), and the PN junction(s) between the P-type region(s) and the sinker region form the PN junction diode(s) of the resistor circuit. According to an embodiment, placing the PN diode(s) alongside the Schottky diode allows the PN junction(s) to deplete the silicon under the Schottky diode, thus reducing reverse-biased leakage in the Schottky diode. The Schottky diode and the PN junction diode(s) can be designed to provide a desired application-dependent breakdown voltage (e.g., a breakdown voltage greater than, less than, or equal to the normal, most negative operating voltage). For example, in an embodiment, the Schottky diode and the PN junction diode(s) each may be designed to provide a reverse breakdown voltage in a range of about −0.3 volts to about −14.0 volts, although smaller or larger breakdown voltages may be achieved, as well.

In the above-described embodiments of PLDMOSFETs, the body region (e.g., body region 834, FIG. 8) and the isolation structure are merged, and the isolation structure (or more specifically the sinker region (e.g., sinker region 822, FIG. 8)) can be considered to be a body tie. In such embodiments, when a resistor circuit (e.g., resistor circuit 162, FIG. 1) is coupled to the source terminal, a body bias may be created during operation, as the source region-to-body region junction may become forward biased. In alternate embodiments, which will be described in more detail in conjunction with FIGS. 14-20, the body region and the isolation structure may be separated by a region of P-type material (e.g., a portion of the substrate associated with the active area or a P-type well), and a distinct body terminal may be provided to facilitate electrical access to the body region. In such embodiments, a resistor circuit similar to the above-described resistor circuits may be coupled between the body region and the isolation structure, rather than coupling the resistor circuit between the source region and the isolation structure, as in the above-described embodiments. In embodiments in which the body region and the isolation structure are separated, the body region and the source region may be tied together (e.g., they may have the same bias during normal operation), and the potential of the isolation structure may be held up by the resistor circuit when a negative potential appears at the source/body terminal. During normal operation, when the body region, source region, and isolation structure are all at high potentials, the isolation region and the body region can effectively be shorted through the lateral depletion of the P-type material between them (e.g., which may be completely depleted before breakdown between them), or through the vertical depletion of the portion of the P-type substrate between the body region and the NBL, whichever comes first.

Figure 14:
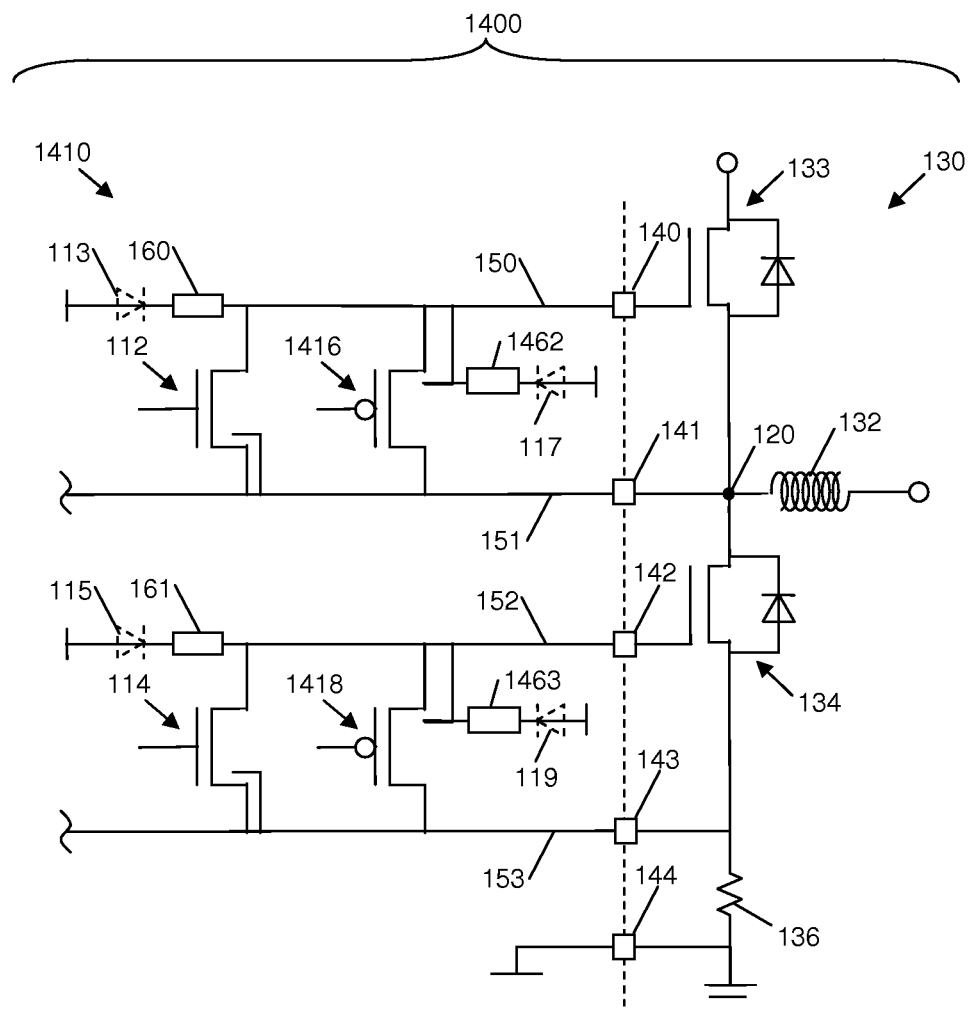
FIG. 14 is a simplified diagram of an electronic system that includes a driver circuit configured to drive an external circuit that includes an inductive load, according to an alternate embodiment.

For example, FIG. 14 is a simplified diagram of an electronic system 1400 that includes a driver circuit 1410, in accordance with another embodiment. Substantial portions of system 1400 are similar to system 100 depicted in FIG. 1, and like reference numbers between FIG. 1 and FIG. 14 represent analogous system elements. In the interest of brevity, those like system elements are not discussed in detail here, although their descriptions, above, apply equally to the system of FIG. 14.

System 1400 differs from system 100, in that driver circuit 1410 includes a resistor circuit 1462 coupled between the body region and the isolation structure of PLDMOSFET 1416 (rather than resistor circuit 162 coupled between the source region and the isolation structure, as for PLDMOSFET 116, FIG. 1). In addition, driver circuit 1410 includes a resistor circuit 1463 coupled between the body region and the isolation structure of PLDMOSFET 1418 (rather than resistor circuit 163 coupled between the source region and the isolation structure, as for PLDMOSFET 118, FIG. 1). Resistor circuits 1462, 1463 are configured to reduce or eliminate current injection into the SOC substrate under previously-described operating conditions.

The insertion of resistor circuits 1462, 1463 between the body regions and isolation structures of PLDMOSFETs 1416, 1418 is possible because the body regions and isolation structures of PLDMOSFETs 1416, 1418 are not merged, in various embodiments. More specifically, in the PLDMOSFETs 1416, 1418 of FIG. 14, the body regions and isolation structures are separated by a region of P-type material, as mentioned previously, and as will be discussed in more detail in conjunction with FIGS. 15-20. With the body region and isolation structure separated, a body bias that may otherwise be created during operation (e.g., in the previously-described embodiments in which the body region and isolation structure are merged) is avoided by tying together (e.g., shorting) the source and body regions, and placing a resistor circuit (e.g., resistor circuits 1462, 1463) between the isolation structure and the source/body regions, which are tied together. In addition, as with the previously-described embodiments, by inserting the resistor circuits 1462, 1463 between the body regions and isolation structures of PLDMOSFETs 1416, 1418, the injection current can be reduced or eliminated in system 1400.

Additional embodiments of PLDMOSFETs (e.g., PLDMOSFET 1416) and associated resistor circuits (e.g., resistor circuit 1462) are described in more detail below. For example, according to an embodiment, a resistor circuit 1462 coupling the body region and isolation structure of PLDMOSFET 1416 includes a resistive network. Such an embodiment is illustrated in FIG. 15, which is a cross-sectional view of a PLDMOSFET 1500 (e.g., PLDMOSFET 1416, FIG. 1) with a resistor circuit (e.g., resistor circuit 1462, FIG. 14) that includes a resistive network, as will be explained in more detail below. Although the figures and description herein particularly apply to a double gate finger configuration, the scope of the inventive subject matter is not limited to such configurations. Those of skill in the art would understand, based on the description herein, how to modify the illustrated and described embodiments to apply to configurations that include multiple (i.e., >2) gate fingers, where adjacent gate fingers may share a drain (e.g., drain region 1536) on one side and a body contact region (e.g., body contact region 1535) on the other side (or in extreme cases, over source region 1538). In such embodiments, the body contact region may be more laterally separated from the sinker region (e.g., sinker region 1522) than is depicted in the figures.

PLDMOSFET 1500 is formed in and on a semiconductor substrate 1510 (e.g., the SOC substrate discussed in conjunction with FIG. 1), which has a top substrate surface 1512. According to an embodiment, PLDMOSFET 1500 includes an isolation structure that substantially surrounds a portion 1516 of the substrate associated with an active area 1530 of the PLDMOSFET 1500 (i.e., an area of the substrate 1510 within which an active device is formed). In other words, the active device may be considered to be contained by the isolation structure. The isolation structure is a box-type structure, which is formed from an NBL 1520 (located at a depth below the top substrate surface 1512) and an N-type sinker region 1522 extending from the top substrate surface 1512 to the depth of the NBL 1520. The sinker region 1522 may be formed using a single implantation procedure having an implant energy sufficient to enable the sinker region 1522 to extend to the NBL 1520, or the sinker region 1522 may be formed using multiple implantation procedures having different implant energies, thus forming a series of interconnected sinker sub-regions at different depths.

PLDMOSFET 1500 further includes an active device formed within the active area 1530. According to an embodiment, the active device includes a P-type drift region 1532, an N-type body region 1534, a P-type drain region 1536, a P-type source region 1538, and a gate electrode 1542 (and corresponding gate dielectric, not numbered). The drift region 1532 is formed within a central portion of the active area 1530, and extends from the top substrate surface 1512 into the substrate 1510 to a depth that is less than the depth of NBL 1520. The drain region 1536 is formed within the drift region 1532, and is more heavily doped than the drift region 1532. The drain region 1536 extends from the top substrate surface 1512 into the substrate 1510 to a depth significantly less than the depth of the drift region 1532. A conductive interconnect electrically couples the drain region 1536 to a drain terminal 1566.

The body region 1534 is formed between the drift region 1532 and the sinker region 1522, and extends from the top substrate surface 1512 into the substrate 1510 to a depth that is less than the depth of NBL 1520, and that may be greater than the depth of the drift region 1532 (although body region 1534 may extend to depths that are less than or substantially equal to the depth of the drift region 1532, as well). An N-type body contact region 1535 is formed within the body region 1534 between source region 1538 and sinker region 1522. The body contact region 1535 may be more heavily doped than the body region 1534. In an embodiment, the body region 1534 abuts the drift region 1532. In alternate embodiments, the body region 1534 may be laterally separated from the drift region 1532, or the body region 1534 may overlap the drift region 1532 (creating regions with dopant profiles that differ from that in the channel or drift region 1532).

According to an embodiment, the body region 1534 is laterally separated from the sinker region 1522 by a region 1537 of P-type material, referred to herein as a "P-type gap". According to an embodiment, the P-type gap 1537 is formed from a portion of P-type substrate material 1516 contained by the isolation structure, where the P-type gap 1537 extends between the body region 1534 and the sinker region 1522 toward the top substrate surface 1512. In alternate embodiments, the P-type gap 1537 may be formed from a P-type well (e.g., a high voltage P-well or a low voltage P-well) formed between the body region 1534 and the sinker region 1522.

Gate electrode 1542 is formed over a gate oxide on the top substrate surface 1512 generally between the drain region 1536 and the source region 1538. A conductive interconnect electrically couples the gate electrode 1542 to a gate terminal 1564. Source region 1538 is formed within the body region 1534, extending from the top substrate surface 1512 into the substrate 1510 to a depth significantly less than the depth of the body region 1534. The source region 1538 may be more heavily doped than the drift region 1532. A conductive interconnect electrically couples the source region 1538 to a source terminal 1562.

Figure 15:
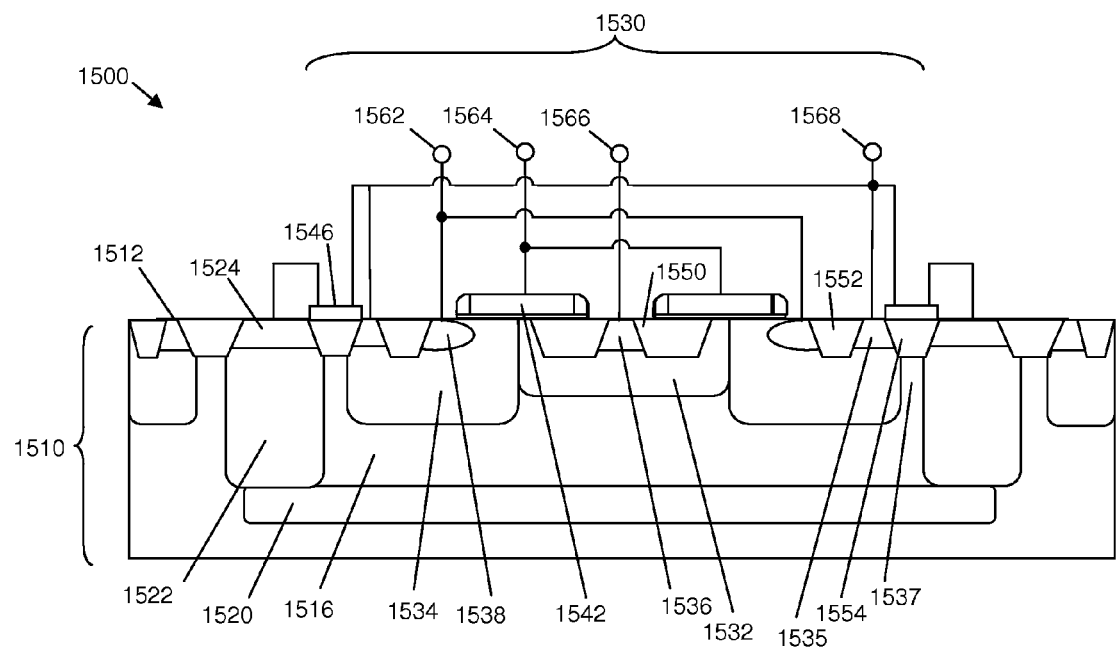
FIG. 15 is a cross-sectional view of a PLDMOSFET with a resistor circuit connected between a body region and an isolation structure of the PLDMOSFET, according to an alternate embodiment.

According to an embodiment, PLDMOSFET 1500 may further include various STI structures 1550, 1552, 1554 as shown in FIG. 15. For example, at the top substrate surface 1512, STI 1550 abuts the drain region 1536 within drift region 1532, STI 1552 is positioned between the source region 1538 and body contact region 1535, and STI 1554 is positioned between body region 1534 and the isolation structure (or more specifically, sinker region 1522). In alternate embodiments, one or more of STI structures 1550, 1552, and/or 1554 may be excluded. In still other alternate embodiments, some or all of the STI structures may be replaced with a silicide blocking layer that prevents silicide formation at the surface that would otherwise short the various regions together.

According to an embodiment, PLDMOSFET 1500 further includes a resistor circuit (e.g., resistor circuit 1462, FIG. 14) connected between source region 1538 and an N-type region 1524 extending into the sinker region 1522, where N-type region 1524 is more heavily doped than the sinker region 1522 to provide for Ohmic contact to sinker region 1522. For example, the resistor circuit may include a resistive network with one or more resistors 1546. Although only one resistor 1546 is shown in FIG. 15, it is to be understood that a resistive network may include multiple resistors. The resistor(s) 1546 of the resistive network may be formed from polycrystalline silicon, and may be located on one or more insulated regions of the top surface of the substrate (e.g., on STI 1552 or 1554). Alternatively, one or more of the resistors 1546 may be formed from other materials and/or located elsewhere. According to an embodiment, a conductive interconnect electrically couples the body region 1534 (via body contact region 1535), a first terminal of the resistive network (e.g., a first terminal of resistor 1546), and a body terminal 1568. Another conductive interconnect electrically couples a second terminal of the resistive network (e.g., a second terminal of resistor 1546) to the isolation structure (e.g., to the N-type region 1524). In an embodiment, the resistive network has a resistance in a range of about 10 to about 20,000 ohms, although smaller or larger resistances may be used, as well.

As mentioned previously, and as indicated in FIG. 14, body region 1534 and source region 1538 may be electrically coupled (shorted) through a conductive interconnect (not illustrated in FIG. 15), and the resistor circuit (e.g., resistor circuit 1462, FIG. 14) may be electrically coupled between the isolation structure (e.g., sinker region 1522) and the shorted source and body regions. In other words, source terminal 1562 and body terminal 1568 may be shorted together. During normal operation, when the body region 1534, source region 1538, and isolation structure all are at high potentials, the isolation structure and body region 1534 can be effectively shorted through the lateral depletion of the P-type gap 1537 between them (e.g., which may be completely depleted before breakdown between them), or through the vertical depletion of the portion of the P-type substrate between the body region 1534 and NBL 1520, whichever comes first.

Figure 16:
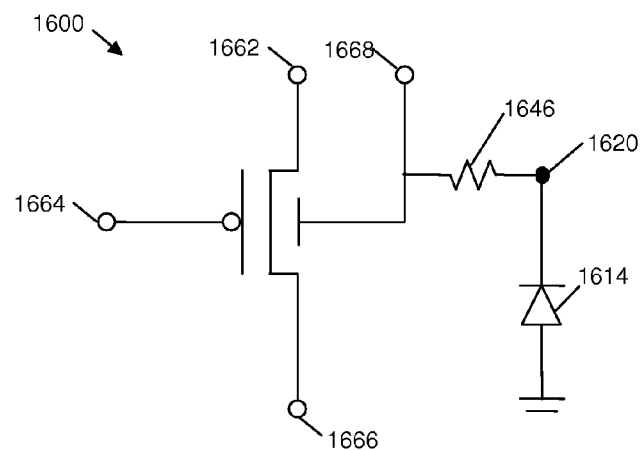
FIG. 16 is a simplified circuit representation of the PLDMOSFET of FIG. 15, according to an embodiment.

FIG. 16 is a simplified circuit representation 1600 of the PLDMOSFET 1500 of FIG. 15, according to an embodiment. Referring also to FIG. 15, terminal 1662 (e.g., terminal 1562) is coupled with the source region (e.g., source region 1538), terminal 1664 (e.g., terminal 1564) is coupled with the gate electrode (e.g., gate electrode 1542), terminal 1666 (e.g., terminal 1566) is coupled with the drain region (e.g., drain region 1536), and terminal 1668 (e.g., terminal 1568 is coupled to the body region (e.g., via body contact region 1535).

According to an embodiment, and as discussed above, the PLDMOSFET also includes a resistor circuit (e.g., including resistive network 1646) electrically coupled between the body region (e.g., body region 1534 via body contact 1535) and the device's isolation structure. More specifically, a first terminal of the resistive network 1646 is coupled to the body region, and a second terminal of the resistive network 1646 is coupled to the isolation structure (e.g., the combination of sinker region 1522 and NBL 1520). At node 1620, diode 1614 represents the diode formed by the interface between the isolation structure and the portion of the substrate outside of the isolation structure.

During normal operation in which the body potential is equal or above the substrate voltage level (e.g., elevated), the isolation structure potential closely follows that of the body region with a voltage drop across resistive network 1646 that depends on the amount of current flowing through the body region. On the other hand, when the body potential transitions to a negative voltage, the isolation structure potential is held up by the voltage drop across the resistive network 1646. By holding up the potential of the isolation structure when the body potential goes negative, carrier injection into the substrate that may otherwise occur if the body and isolation structure were merely shorted may be reduced or eliminated, thus avoiding disruption of adjacent circuit blocks.

Figure 17:
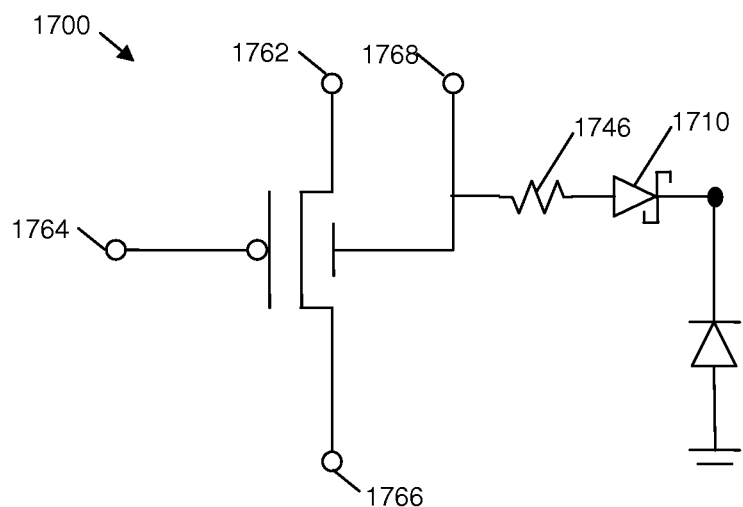
FIG. 17 is a simplified circuit representation of the PLDMOSFET of FIG. 15 with a resistor circuit that includes a resistive network in series with a Schottky diode, according to an alternate embodiment.

According to another embodiment, the resistor circuit (e.g., resistor circuit 1462, FIG. 14) may include a resistive network in series with a Schottky diode. For example, FIG. 17 is a simplified circuit representation 1700 of the PLDMOSFET 1500 of FIG. 15 with a resistor circuit that includes a resistive network 1746 in series with a Schottky diode 1710, according to an alternate embodiment. Referring also to FIG. 15, terminal 1762 (e.g., terminal 1562) is coupled with the source region (e.g., source region 1538), terminal 1764 (e.g., terminal 1564) is coupled with the gate electrode (e.g., gate electrode 1542), terminal 1766 (e.g., terminal 1566) is coupled with the drain region (e.g., drain region 1536), and terminal 1768 (e.g., terminal 1568) is coupled with the body region (e.g., via body contact region 1535).

Schottky diode 1710 and resistive network 1746 are electrically coupled in series between the body region (e.g., body region 1534 via body contact 1535) and the device's isolation structure. Schottky diode 1710 may be formed, for example, by a Schottky contact (not illustrated) in contact with the isolation structure (e.g., with sinker region 1522). More particularly, in an embodiment, the Schottky diode may be formed from the metal-semiconductor junction between a Schottky contact (e.g., formed with silicide on the top substrate surface) and the top surface of sinker region 1522. In an alternate embodiment, the Schottky contact may be formed on a sidewall or other surface that is not co-planar with the top substrate surface 1512.

During operation, when the body potential transitions to a negative voltage, the isolation structure potential is held up by the voltage drop across resistive network 1746 in series with the reverse breakdown voltage of the Schottky diode 1710. The combination of the Schottky diode 1710 and resistive network 1746 may allow for more flexibility in the construction of the Schottky diode 1710. In addition, in choosing a value for resistive network 1746 to achieve optimum overall results in maintaining the PLDMOSFET's integrity, ESD robustness may be achieved while reducing substrate injection. More specifically, for example, under conditions in which the Schottky diode 1710 is run into breakdown (e.g., during ESD stress), the current through the Schottky diode 1710 is limited by resistive network 1746 to the extent of its capability, thus reducing the likelihood that an ESD event may damage Schottky diode 1710.

Figure 18:
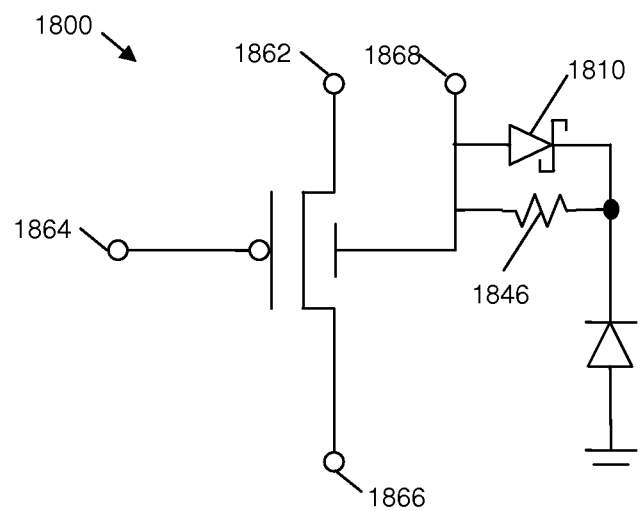
FIG. 18 is a simplified circuit representation of the PLDMOSFET of FIG. 15 with a resistor circuit that includes a resistive network in parallel with a Schottky diode, according to another alternate embodiment.

According to yet another embodiment, the resistor circuit (e.g., resistor circuit 1462, FIG. 14) may include a resistive network in parallel with a Schottky diode. For example, FIG. 18 is a simplified circuit representation 1800 of the PLDMOSFET 1500 of FIG. 15 with a resistor circuit that includes a resistive network 1846 in parallel with a Schottky diode 1810, according to an alternate embodiment. Referring also to FIG. 15, terminal 1862 (e.g., terminal 1562) is coupled with the source region (e.g., source region 1538), terminal 1864 (e.g., terminal 1564) is coupled with the gate electrode (e.g., gate electrode 1542), terminal 1866 (e.g., terminal 1566) is coupled with the drain region (e.g., drain region 1536), and terminal 1868 (e.g., terminal 1568) is coupled with the body region (e.g., via body contact region 1535).

Schottky diode 1810 (e.g., the interface between a Schottky contact (not illustrated) and sinker region 1522) and resistive network 1846 are electrically coupled in parallel between the body region (e.g., body region 1534 via body contact 1535) and the device's isolation structure.

During operation, when the source potential transitions to a negative voltage, the isolation structure potential is held up by the voltage drop across resistive network 1846 in parallel with the reverse breakdown voltage of the Schottky diode 1810. As with the resistor circuit discussed in conjunction with FIG. 17, the combination of the Schottky diode 1810 and resistive network 1846 may allow for more flexibility in the construction of the Schottky diode 1810. In addition, resistive network 1846 may function to maintain the potential of the isolation structure closer to the body potential of the PLDMOSFET, under certain circumstances. For example, when the body potential is falling (although still positive), the potential of the isolation structure is pulled down only by the capacitance of Schottky diode 1810, which may or may not be sufficient. In such a case, resistive network 1846 may help to discharge the potential of the isolation structure towards the body potential. Although some minority carrier injection may be added when the body potential transitions negative, resistive network 1846 may limit the amount of carrier injection.

In the embodiments discussed in conjunction with FIGS. 17 and 18, a resistor circuit (e.g., resistor circuit 1462, FIG. 14) includes a resistive network (e.g., resistive networks 1746, 1846) coupled in series (FIG. 17) or in parallel (FIG. 18) with a Schottky diode. In another alternate embodiment, a resistor circuit may include a Schottky diode and both a first resistive network coupled in series and a second resistive network coupled in parallel with the Schottky diode, in order to realize the advantages that may be provided by both the series-coupled and parallel-coupled resistive network arrangements.

In the embodiments discussed in conjunction with FIGS. 17 and 18, a resistor circuit (e.g., resistor circuit 1462, FIG. 14) coupling the body region and isolation structure of an embodiment of a PLDMOSFET (e.g., PLDMOSFET 1416, FIG. 14) includes a Schottky diode. According to another embodiment, a resistor circuit (e.g., resistor circuit 1462, FIG. 14) includes a resistive network and a PN junction diode (not illustrated) connected between the body region (e.g., body region 1534 via body contact 1535, FIG. 15) and the isolation structure. For example, referring again to FIG. 15, instead of including N-type region 1524, PLDMOSFET 1500 may also include a P-type region (not illustrated) extending into sinker region 1522, where the P-type region is more heavily doped than P-type drift region 1532. The PN junction between the P-type region and the sinker region 1522 forms a PN junction diode, which may be interconnected within the resistor circuit. The PN junction diode can be designed to provide a desired application-dependent breakdown voltage (e.g., a breakdown voltage greater than, less than, or equal to the normal, most negative operating voltage). For example, in an embodiment, the PN junction diode may be designed to provide a reverse breakdown voltage in a range of about −0.3 volts to about −14.0 volts, although smaller or larger breakdown voltages may be achieved, as well.

According to yet another embodiment, a resistor circuit (e.g., resistor circuit 1462, FIG. 14) may include a resistive network and a polycrystalline silicon diode (not illustrated) connected between the body region (e.g., body region 1534 via body contact 1535, FIG. 15) and the isolation structure. For example, a polycrystalline silicon diode may be formed from a P-type region and an N-type region separated by a neutral spacer region that defines the breakdown voltage of polycrystalline silicon diode. The polycrystalline silicon diode may be formed on an insulated region of the top surface of the substrate (e.g., on STI 1552 or 1554). Alternatively, the polycrystalline silicon diode may be formed from other materials and/or located elsewhere. In an embodiment, the polycrystalline silicon diode may be designed to provide a desired application-dependent reverse breakdown voltage that is less than, greater than, or equal to the normal, most negative operating voltage (e.g., in a range of about −0.3 volts to about −14.0 volts, although smaller or larger breakdown voltages may be achieved, as well).

Figure 19:
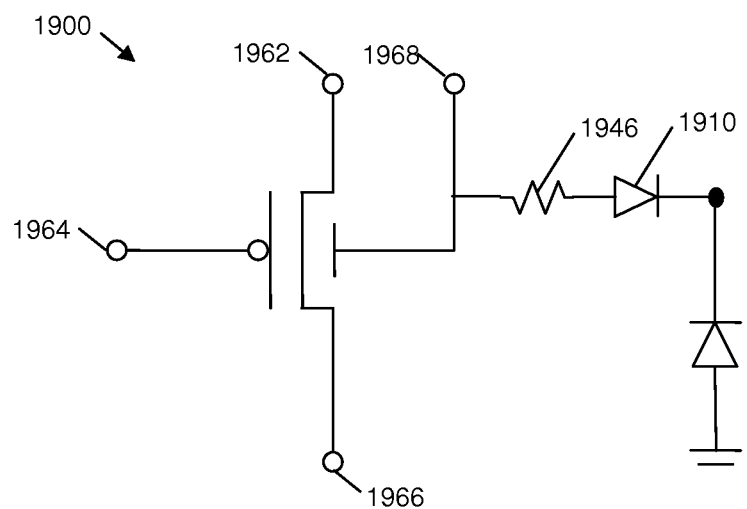
FIG. 19 is a simplified circuit representation of the PLDMOSFETs of FIG. 15 with a resistor circuit that includes a resistive network in series with a PN junction diode, according to an alternate embodiment.

FIG. 19 is a simplified circuit representation 1900 of the PLDMOSFET 1500 of FIG. 15 with a resistor circuit that includes a resistive network 1946 in series with a PN junction diode 1910 (e.g., a PN junction diode formed from a PN junction between a P-type region and the sinker region 1522, or a polycrystalline silicon diode), according to an alternate embodiment. Referring also to FIG. 15, terminal 1962 (e.g., terminal 1562) is coupled with the source region (e.g., source region 1538), terminal 1964 (e.g., terminal 1564) is coupled with the gate electrode (e.g., gate electrode 1542), terminal 1966 (e.g., terminal 1566) is coupled with the drain region (e.g., drain region 1536), and terminal 1968 (e.g., terminal 1568) is coupled with the body region (e.g., via body contact region 1535).

Resistive network 1946 and PN junction diode 1910 are electrically coupled in series between the body region (e.g., body region 1534 via body contact 1535) and the device's isolation structure. During operation, when the body potential transitions to a negative voltage, the isolation structure potential is held up by the voltage drop across resistive network 1946 in series with the reverse breakdown voltage of the PN junction diode 1910. As with the embodiment previously discussed in conjunction with FIG. 17, the combination of the PN junction diode 1910 and resistive network 1946 may provide certain advantageous effects.

Figure 20:
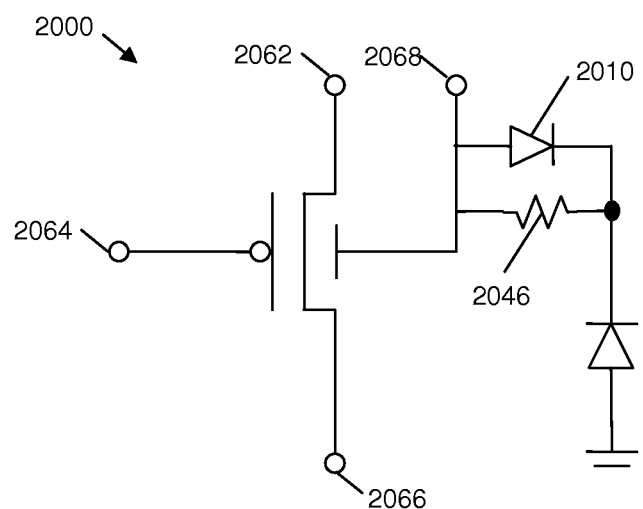
FIG. 20 is a simplified circuit representation of the PLDMOSFETs of FIG. 15 with a resistor circuit that includes a resistive network in parallel with a PN junction diode, according to another alternate embodiment.

According to yet another embodiment, the resistor circuit (e.g., resistor circuit 1462, FIG. 14) may include a resistive network in parallel with a PN junction diode. For example, FIG. 20 is a simplified circuit representation 2000 of the PLDMOSFET 1500 of FIG. 15 with a resistor circuit that includes a resistive network 2046 in parallel with a PN junction diode 2010, according to an alternate embodiment. Similar to the embodiment of FIG. 15, terminal 2062 (e.g., terminal 1562) is coupled with the source region (e.g., source region 1538), terminal 2064 (e.g., terminal 1564) is coupled with the gate electrode (e.g., gate electrode 1542), terminal 2066 (e.g., terminal 1566) is coupled with the drain region (e.g., drain region 1536), and terminal 2068 (e.g., terminal 1568) is coupled with the body region (e.g., via body contact region 1535).

Resistive network 2046 and PN junction diode 2010 are electrically coupled in parallel between the body region (e.g., body region 1534 via body contact 1535) and the device's isolation structure. During operation, when the body potential transitions to a negative voltage, the isolation structure potential is held up by the voltage drop across resistive network 2046 in parallel with the reverse breakdown voltage of the PN junction diode 2010. As with the resistor circuit discussed in conjunction with FIG. 19, the combination of the PN junction diode 2010 and resistive network 2046 may have certain advantageous effects.

In the embodiments discussed in conjunction with FIGS. 19 and 20, a resistor circuit (e.g., resistor circuit 1462, FIG. 14) includes a PN junction diode (e.g., PN junction diodes 1910, 2010) and either a resistive network coupled in series (resistive network 1946) or a resistive network coupled in parallel (resistive network 2046) with the PN junction diode. In another alternate embodiment, a resistor circuit may include a PN junction diode and both a first resistive network coupled in series and a second resistive network coupled in parallel with the PN junction diode, in order to realize the advantages that may be provided by both the series-coupled and parallel-coupled resistive network arrangements.

In the embodiments discussed in conjunction with FIGS. 17-20, a resistor circuit (e.g., resistor circuit 1462, FIG. 14) coupling the body region and isolation structure of an embodiment of an PLDMOSFET (e.g., PLDMOSFET 1416, FIG. 14) includes either a Schottky diode or a PN junction diode. According to other embodiments, a resistor circuit coupling the body region and isolation structure of an embodiment of a PLDMOSFET instead may include a combination of one or more Schottky diodes and one or more PN junction diodes. For example, an embodiment of a PLDMOSFET may include a combination of a Schottky diode and one or more PN junction diodes connected in parallel between the body region and the isolation structure. More particularly, the resistor circuit may include a Schottky diode formed from a metal-semiconductor junction between a Schottky contact and the isolation structure (e.g., sinker region 1522), along with one or more P-type regions, each extending into the sinker region and partially across the sinker region. The Schottky contact is connected to the resistive network (i.e., the anode of the Schottky diode is connected to the resistive network), and the PN junction(s) between the P-type region(s) and the sinker region form the PN junction diode(s) of the resistor circuit. According to an embodiment, placing the PN diode(s) alongside the Schottky diode allows the PN junction(s) to deplete the silicon under the Schottky diode, thus reducing reverse-biased leakage in the Schottky diode. The Schottky diode and the PN junction diode(s) can be designed to provide a desired application-dependent breakdown voltage (e.g., a breakdown voltage greater than, less than, or equal to the normal, most negative operating voltage). For example, in an embodiment, the Schottky diode and the PN junction diode(s) each may be designed to provide a reverse breakdown voltage in a range of about −0.3 volts to about −14.0 volts, although smaller or larger breakdown voltages may be achieved, as well.

Figure 21:
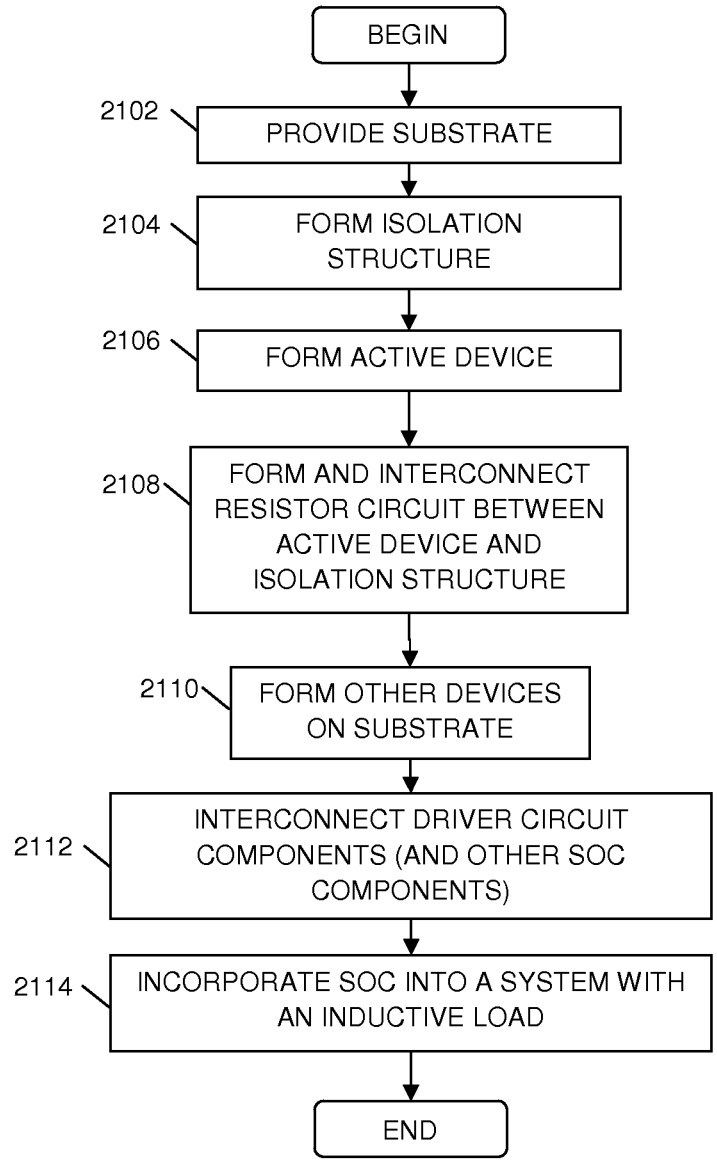
FIG. 21 is a simplified flow diagram illustrating a method for forming the devices illustrated in FIGS. 2, 8, and 15, and incorporating those devices into a system with an inductive load, according to various embodiments.

FIG. 21 is a simplified flow diagram illustrating a method for forming the devices illustrated, for example in FIGS. 2, 8, and 15, and incorporating those devices into an SOC and a system (e.g., system 100, 1400, FIGS. 1, 14) with an inductive load (e.g., inductive load 132, FIGS. 1, 14), according to various embodiments. Standard semiconductor processing techniques may be employed in producing the SOC, and for the purpose of brevity, those techniques are not described in detail herein.

The method begins, in block 2102, by providing a substrate (e.g., an SOC substrate) having a first conductivity type (e.g., P-type substrate 210, 810, 1510). The substrate may include a base substrate and an epitaxial layer grown on the base substrate, for example. An active device (e.g., associated with a driver circuit) may then be formed (blocks 2104, 2106, 2108). For example, in block 2104, an isolation structure may be formed in the substrate. As described in detail previously, the isolation structure may include a buried layer of a second conductivity type (e.g., NBL 220, 820, 1520) and a sinker region of the second conductivity type (e.g., sinker region 222, 822, 1522) extending from the substrate top surface to the buried layer. The isolation structure formed from the combination of the buried layer and sinker region may substantially surround an active area of the device (e.g., active area 230, 830, 1530). In block 2106, an active device may be formed within the active area. For example, among other things, an active device formed in the active area may include a drift region, a body region, a gate, and current carrying regions adjacent opposite ends of a channel region of the device (e.g., a drain region and a source region), as previously described.

In block 2108, a resistor circuit (e.g., resistor circuit 162, FIG. 1) may be formed and interconnected between the active device and the isolation structure (or more specifically the sinker region, such as sinker region 222, 822, 1522). For example, in the case of manufacturing an NLDMOSFET (e.g., NLDMOSFET 200, FIG. 2), a resistor circuit may be interconnected between the device's drain region and the isolation structure. Conversely, in the case of manufacturing a PLDMOSFET (e.g., PLDMOSFET 800, 1500, FIGS. 8, 15), a resistor circuit may be interconnected between the device's source region (FIG. 8) or body region (FIG. 15) and the isolation structure. As described in detail above, embodiments of resistor circuits may include one or more resistive networks, Schottky diodes, and/or PN junction diodes.

In block 2110, which may be performed in parallel with blocks 2104, 2106, and 2108, "other devices" may be formed in and on the substrate, including forming additional devices associated with a driver circuit (e.g., driver circuit 110, FIG. 1) and additional devices associated with a system on a chip (SOC) (e.g., processing components, memory arrays, and other circuitry). The driver circuit and other SOC components may be interconnected, in block 2112, and the SOC substrate may be packaged, thus completing fabrication of the SOC. In block 2114, the SOC, whether packaged or not, may be incorporated into a larger system, such as a system that includes an inductive load (e.g., inductive load 132, FIG. 1), and the method may end.

As discussed previously, the device formed in blocks 2104, 2106, and 2108 is configured to reduce current injection into the SOC substrate under various operating conditions. More particularly, the resistor circuit coupled between a current carrying region (e.g., a drain or source region) and the isolation structure of at least one active device of the driver circuit may result in reduction of injection current, when compared with other systems in which such a resistor circuit is not present (e.g., in systems in which the source region, body region, and isolation structure are merely shorted together). Accordingly, the various embodiments may produce significant advantageous results.

While at least one exemplary embodiment has been presented in the foregoing detailed description, it should be appreciated that a vast number of variations exist, especially with respect to choices of device types, materials and doping. It should be appreciated that the exemplary embodiment or exemplary embodiments are only examples, and are not intended to limit the scope, applicability, or configuration of the embodiments in any way. Rather, the foregoing detailed description will provide those skilled in the art with a convenient road map for implementing the exemplary embodiment or exemplary embodiments. It should be understood that various changes can be made in the function and arrangement of elements without departing from the scope of the inventive subject matter as set forth in the appended claims and the legal equivalents thereof.

What is claimed is:

1. A semiconductor device, comprising:
   a semiconductor substrate having a first conductivity type and a top substrate surface;
   a buried layer below the top substrate surface, wherein the buried layer has a second conductivity type that is different from the first conductivity type;
   a sinker region between the top substrate surface and the buried layer, wherein the sinker region has the second conductivity type, and an isolation structure that isolates a portion of the substrate from a remainder of the semiconductor substrate is formed by the sinker region and the buried layer;
an active device in the semiconductor substrate within the portion of the substrate contained by the isolation structure, wherein the active device includes
a drift region of the first conductivity type within a central portion of the active area and extending from the top substrate surface into the semiconductor substrate,
a drain region of the first conductivity type, wherein the drain region extends into the drift region from the top substrate surface, and
a body region of the second conductivity type extending from the top substrate surface into the semiconductor substrate and positioned between the drift region and the isolation structure, wherein the body region and the isolation structure are separated by a portion of the semiconductor substrate having the first conductivity type; and
a resistor circuit having a first terminal connected to the isolation structure and a second terminal connected to the body region.

2. The semiconductor device of claim 1, wherein the resistor circuit comprises:
a polycrystalline silicon resistor.

3. The semiconductor device of claim 1, wherein the resistor circuit comprises:
a first resistive network; and
a Schottky diode coupled to the first resistive network, wherein the Schottky diode is formed from a Schottky contact coupled with the isolation region.

4. The semiconductor device of claim 3, wherein:
the Schottky diode is coupled to the first resistive network in series.

5. The semiconductor device of claim 3, wherein:
the Schottky diode is coupled to the first resistive network in parallel.

6. The semiconductor device of claim 5, wherein the resistor circuit further comprises:
a second resistive network coupled to the Schottky diode in series.

7. The semiconductor device of claim 3, wherein the resistor circuit further comprises:
a PN junction diode coupled to the Schottky diode in parallel.

8. The semiconductor device of claim 1, wherein the resistor circuit comprises:
a first resistive network; and
a PN junction diode coupled to the first resistive network.

9. The semiconductor device of claim 8, wherein:
the PN junction diode is coupled to the first resistive network in series.

10. The semiconductor device of claim 8, wherein:
the PN junction diode is coupled to the first resistive network in parallel.

11. The semiconductor device of claim 10, wherein the resistor circuit further comprises:
a second resistive network coupled to the PN junction diode in series.

12. The semiconductor device of claim 8, further comprising:
a further region of the first conductivity type extending into the sinker region, wherein the PN junction diode is formed between the further region and the sinker region.

13. The semiconductor device of claim 8, wherein the PN junction diode comprises a polycrystalline silicon diode.

14. The semiconductor device of claim 1, wherein the active device comprises:
a drift region of the first conductivity type within a central portion of the active area and extending from the top substrate surface into the semiconductor substrate;
a drain region of the first conductivity type extending into the drift region from the top substrate surface;
the body region extending from the top substrate surface into the semiconductor substrate between the drift region and the isolation structure; and
a source region of the first conductivity type extending into the body region from the top substrate surface.

15. A driver circuit comprising:
a first laterally diffused metal oxide semiconductor field effect transistor (LDMOSFET) formed on a semiconductor substrate having a first conductivity type and a top substrate surface, wherein the first LDMOSFET includes
a buried layer below the top substrate surface, wherein the buried layer has a second conductivity type that is different from the first conductivity type,
a sinker region between the top substrate surface and the buried layer, wherein the sinker region has the second conductivity type, and an isolation structure that isolates a portion of the substrate from a remainder of the semiconductor substrate is formed by the sinker region and the buried layer,
an active device in the semiconductor substrate within the portion of the substrate contained by the isolation structure, wherein the active device includes
a drift region of the first conductivity type within a central portion of the active area and extending from the top substrate surface into the semiconductor substrate,
a drain region of the first conductivity type, wherein the drain region extends into the drift region from the top substrate surface, and
a body region of the second conductivity type extending from the top substrate surface into the semiconductor substrate and positioned between the drift region and the isolation structure, wherein the body region and the isolation structure are separated by a portion of the semiconductor substrate having the first conductivity type; and
a resistor circuit having a first terminal connected to the isolation structure and a second terminal connected to the body region.

16. The driver circuit of claim 15, wherein the resistor circuit comprises:
a polycrystalline silicon resistor.

17. The driver circuit of claim 15, wherein the resistor circuit comprises:
a first resistive network; and
a Schottky diode coupled to the first resistive network, wherein the Schottky diode is formed from a Schottky contact coupled with the isolation region.

18. The driver circuit of claim 17, wherein the Schottky diode is coupled to the first resistive network in parallel, and the resistor circuit further comprises:
a second resistive network coupled to the Schottky diode in series.

19. The driver circuit of claim 15, wherein the resistor circuit comprises:
a first resistive network; and
a PN junction diode coupled to the resistive network.

20. The driver circuit of claim 19, further comprising:
a further region of the first conductivity type extending into the sinker region, wherein the PN junction diode is formed between the further region and the sinker region.

21. The driver circuit of claim 19, wherein the PN junction diode comprises a polycrystalline silicon diode.

22. The driver circuit of claim 19, wherein the PN junction diode is coupled to the first resistive network in parallel, and the resistor circuit further comprises:
a second resistive network coupled to the PN junction diode in series.

23. A method for forming a semiconductor device, the method comprising the steps of:
forming a buried layer below a top substrate surface of a semiconductor substrate having a first conductivity type, wherein the buried layer has a second conductivity type that is different from the first conductivity type;
forming a sinker region between the top substrate surface and the buried layer, wherein the sinker region has the second conductivity type, and an isolation structure that isolates a portion of the substrate from a remainder of the semiconductor substrate is formed by the sinker region and the buried layer;
forming an active device in the portion of the semiconductor substrate contained by the isolation structure, wherein the active device includes
a drift region of the first conductivity type within a central portion of the active area and extending from the top substrate surface into the semiconductor substrate,
a drain region of the first conductivity type, wherein the drain region extends into the drift region from the top substrate surface, and
a body region of the second conductivity type extending from the top substrate surface into the semiconductor substrate and positioned between the drift region and the isolation structure, wherein the body region and the isolation structure are separated by a portion of the semiconductor substrate having the first conductivity type; and
connecting a first terminal of a resistor circuit to the isolation structure, and connecting a second terminal of the resistor circuit to the body region.

24. The method of claim 23, wherein forming the resistor circuit comprises:
forming and interconnecting a polycrystalline silicon resistor as part of the resistor circuit.

25. The method of claim 23, wherein the resistor circuit includes a resistive network and a Schottky diode, and forming the resistor circuit comprises:
forming the resistive network;
forming the Schottky diode, wherein the Schottky diode includes a Schottky contact coupled with the isolation region; and
coupling the resistive network to the Schottky contact.

26. The method of claim 23, wherein the resistor circuit includes a resistive network and a PN junction diode, and forming the resistor circuit comprises:
forming the resistive network;
forming a further region of the first conductivity type extending into the sinker region, wherein the PN junction diode is formed between the further region and the sinker region; and
coupling the resistive network to the further region.

27. The method of claim 23, wherein the resistor circuit includes a resistive network and a PN junction diode, and forming the resistor circuit comprises:
forming the resistive network;
forming the PN junction diode as a polycrystalline silicon diode; and
coupling the resistive network to the polycrystalline silicon diode.

\* \* \* \* \*